US005572437A

United States Patent [19]
Rostoker et al.

[11] Patent Number: 5,572,437
[45] Date of Patent: * Nov. 5, 1996

[54] METHOD AND SYSTEM FOR CREATING AND VERIFYING STRUCTURAL LOGIC MODEL OF ELECTRONIC DESIGN FROM BEHAVIORAL DESCRIPTION, INCLUDING GENERATION OF LOGIC AND TIMING MODELS

[75] Inventors: Michael D. Rostoker, Boulder Creek; Carlos Dangelo, Los Gatos; Owen S. Bair, Sarotoga, all of Calif.

[73] Assignee: LSI Logic Corporation, Milpitas, Calif.

[*] Notice: The portion of the term of this patent subsequent to Jun. 22, 2010, has been disclaimed.

[21] Appl. No.: 246,798

[22] Filed: May 20, 1994

Related U.S. Application Data

[63] Continuation-in-part of Ser. No. 85,658, Jun. 30, 1993, Ser. No. 54,053, Apr. 26, 1993, and Ser. No. 77,294, Jun. 14, 1993, said Ser. No. 85,658, is a continuation of Ser. No. 684,668, Apr. 12, 1991, Pat. No. 5,278,769, said Ser. No. 54,053, is a continuation of Ser. No. 507,201, Apr. 6, 1990, Pat. No. 5,222,030.

[51] Int. Cl.$^6$ .................................................. G06F 17/50
[52] U.S. Cl. ........................................ 364/489; 364/488
[58] Field of Search ................................. 364/488, 489, 364/490, 578; 395/500

[56] References Cited

U.S. PATENT DOCUMENTS

| T940,008 | 11/1975 | Oden .................................. | 444/1 |
|---|---|---|---|
| T940,020 | 11/1975 | Brechling et al. ..................... | 444/1 |
| 4,353,117 | 10/1982 | Spellmann ........................... | 364/300 |
| 4,587,625 | 5/1986 | Marino, Jr. et al. ................... | 364/578 |
| 4,635,208 | 1/1987 | Coleby et al. ........................ | 364/491 |
| 4,675,832 | 6/1987 | Robinson et al. ..................... | 364/521 |
| 4,697,241 | 9/1987 | Lavi .................................. | 364/488 |
| 4,703,435 | 10/1987 | Darringer et al. ..................... | 364/489 |
| 4,789,944 | 12/1988 | Wada et al. .......................... | 364/488 |
| 4,805,113 | 2/1989 | Ishii et al. ........................... | 364/491 |
| 4,813,013 | 3/1989 | Dunn .................................. | 364/900 |
| 4,827,427 | 5/1989 | Hyduke .............................. | 364/489 |
| 4,831,543 | 5/1989 | Mastellone .......................... | 364/489 |
| 4,833,619 | 5/1989 | Shimizu et al. ....................... | 364/489 |
| 4,890,238 | 12/1989 | Klein et al. .......................... | 364/491 |
| 4,908,772 | 3/1990 | Chi .................................... | 364/491 |
| 4,918,614 | 4/1990 | Modarres et al. ..................... | 364/490 |
| 4,922,432 | 5/1990 | Kobayashi et al. .................... | 364/490 |
| 4,965,741 | 10/1990 | Winchell et al. ...................... | 364/513 |
| 4,967,367 | 10/1990 | Piednoir ............................. | 364/489 |
| 4,970,664 | 11/1990 | Kaiser et al. ........................ | 364/521 |
| 5,005,136 | 4/1991 | Van Berkel et al. ................... | 364/490 |
| 5,034,899 | 7/1991 | Schult ................................ | 364/518 |
| 5,084,824 | 1/1992 | Lam et al. ........................... | 364/490 |
| 5,111,413 | 5/1992 | Lazansky et al. ..................... | 364/578 |
| 5,164,908 | 11/1992 | Igarashi .............................. | 364/491 |
| 5,164,911 | 11/1992 | Juran et al. .......................... | 364/578 |
| 5,220,512 | 6/1993 | Watkins et al. ....................... | 364/489 |
| 5,222,030 | 6/1993 | Dangelo et al. ...................... | 364/489 |

FOREIGN PATENT DOCUMENTS

| 0319232A2 | 6/1989 | European Pat. Off. .................... | 15/40 |
|---|---|---|---|
| 0463301A2 | 1/1992 | European Pat. Off. .................... | 15/60 |
| 0473960A2 | 3/1992 | European Pat. Off. .................... | 15/40 |

OTHER PUBLICATIONS

"Tango–Schematic Capture Software", PERX Catalog, pp. 18 & 19.

(List continued on next page.)

Primary Examiner—Vincent N. Trans
Attorney, Agent, or Firm—Poms, Smith, Lande & Rose

[57] ABSTRACT

An automatic logic-model generation system operates on a behavioral description of an electronic design (e.g., a circuit, a system, etc.) to automatically generate a low-level (i.e., circuit-level) design of the electronic design, to lay out the electronic design for production in the form of an integrated circuit, and to produce logic-level models incorporating accurate timing (and delay) information. A verification process is also performed whereby the logic-level model is automatically verified for accuracy.

17 Claims, 25 Drawing Sheets

OTHER PUBLICATIONS

"Methods Used in an Automatic Logic Design Generator (ALERT)", by Friedman et al., IEEE Transactions On Computers, vol. C18, No. 7, Jul. 1969, pp. 593–614.

"An Efficient Heuristic Procedure for Partitioning Graphs", by Kernighan et al., The Bell System Technical Journal, Feb. 1970, pp. 291–306.

"Quality Of Designs From An Automatic Logic Generator (ALERT)", by Friedman et al., IEEE Design Automation Conference, 1970, pp. 71–80.

"Design Automation", by Russo, Computer, May/Jun. 1972, pp. 19–22.

"Computer Aided Design", by Lynn, Computer, May/Jun. 1972, pp. 36–45.

"Recent Developments in Design Automation", by Breuer, Computer, May/Jun. 1972, pp. 23–35.

"LINDA: A Local Interactive Design Aid For Computer–Aided General–Purpose Artwork Production", by Briggs, GEC Journal of Science & Technology, vol. 43, No. 2, 1976.

"An Engineering System for Designer, Manager and Manufacturer", by Smith et al., Telesis, vol. 4, No. 9, Dec. 1976, pp. 268–273.

"Computer Graphics In Power Plant Design", by Strong et al., IEEE Power Engineering Society, Jul. 1978.

"An Automated System to Support Design Analysis", By Willis, 12th Annual Asilomar Conference on Circuits, Systems & Computers, IEEE, Nov. 1978. pp. 646–650.

"Computer–Aided Partitioning of Behavorial Hardware Descriptions", by McFarland, 20th Design Automation Conference, IEEE, 1983, pp. 472–478.

"Definite Clause Translation Grammars", by Abramson, University of British Columbia, IEEE, 1984, pp. 233–240.

"VERIFY: A Program for Proving Correctness of Digital Hardware Designs", by Barrow, Artificial Intelligence 24, 1984, pp. 437–483.

"Switch–Level Delay Models For Digital MOS VLSI", by Ousterhout, IEEE 21st Design Automation Conference, 1984, pp. 542–548.

"Automated Generation of Digital System Schematic Diagrams", by Arya et al., 22nd Design Automation Conference, IEEE, 1985, pp. 388–395.

"Using Bottom–Up Design Techniques in the Synthesis of Digital Hardware from Abstract Behavioral Descriptions", by McFarland, 23rd Design Automation Conference, IEEE, 1986, pp. 474–480.

"Partitioning Before Logic Synthesis", by Camposano et al., IBM Thomas J. Watson Research Center, IEEE, 1987, pp. 324–326.

"Partitioning and Placement Technique for CMOS Gate Arrays", by Odawara et al., IEEE Transactions on Computer–Aided Design, vol. CAD–6, No. 3, May 1987, pp. 355–363.

"Partitioning A Design in Structural Synthesis", by Camposano et al., IBM Watson Research Center, IEEE, 1987, pp. 564–566.

"The System Architect's Workbench", by Thomas et al., 1988 DAC Draft Submission, Nov. 1987.

"Formal Verification of Digital Circuits Using Hybrid Simulation", by Srinivas et al., IEEE Circuits and Devices Magazine, Jan. 1988, pp. 19–26.

"Tektronix Design Automation Products", 1988. pp. 83–90.

"Formal Verification of the Sobel Image Processing Chip", by Narendran et al., 25th ACM/IEEE Design Automation Conference, 1988, pp. 211–217.

"Chip Simulation Is All a Matter of Image", by Thacker et al., ESD: The Electronic System Design Magazine, Nov. 1988, pp. 65–70.

"Area–Time Model for Synthesis of Non–Pipelined Designs", by Jain et al., CH2657–5 1988 IEEE, pp. 48–51.

"CAD For System Design: Is It Practical?", IEEE Design & Test of Computers, Apr. 1989, pp. 46–55.

"Architectural Partitioning for System Level Design", by Lagnese et al., 26th ACM/IEEE Design Automation Conference, 1989, pp. 62–67.

"Here's Software To Speed Vector Creation", by Beaverton, Electronics, May 1989, pp. 48–52.

"Here's An Easy Way To Test ASICs", by McLeod, Electronics, May 1989, pp. 116–117.

"Experience woth the ADAM Synthesis System", by Jain et al., 26th ACM/IEEE Design Automation Conference, 1989, pp. 56–61.

"Chippe: A System for Constraint Driven Behavioral Synthesis", by Brewer et al., IEEE Transactions on Computer–Aided Design, vol. 9, No. 7, Jul. 1990, pp. 681–695.

"BAD: Behavioral Area–Delay Predictor", by Kucukcakar et al., CEng Technical Report 90–31, Nov. 1990.

"HYPER–LP: A System for Power Minimization Using Architectural Transformations", by Chadrakasan et al., IEEE, 1992, pp. 300–303.

"The CAR System: Multimedia In Support Of Collaboartive Design", by Handley, IEE Colloquium on 'Multimedia and Professional Applications', Digest No. 026, P. 8/1–5, 1993.

"Coordination And Control For Collaborative Workstation Design", by Pendergast et al., Cambridge Univ. Pres., vii+ 456 pp., 1991.

"PICTIVE–An Exploration In Participatory Design", by Muller, Conference Proceedings, CHI 91, pp. 225–31, 1991.

"Prototyping Approach Of Multi–Actors Computer Aided Design For Buildings In The Frame Of The CIBAO Project", by Dubois, EuropIA, pp. 338–350, 1990.

```
INPIN_ORDER = ENB TCK DINPN MODE SHIFT TDI U6_B

CB/SQ  ffCELL  TIME      PATTERN   INCHG1  INCHG2  OUTCHG   D0    D1
------------------------------------------------------------------------
CB     NIL     NIL       --00--1   MODE    NIL     DOUT     1.1   2.1
SQ     U2      CP_Q      0100000   ENB     NIL     TDO      3.2   NIL
SQ     U2      CP_Q      0110000   ENB     NIL     TDO      NIL   2.9
SQ     U2      CP_QN     0100000   ENB     NIL     TDO      NIL   1.9
SQ     U2      CP_QN     0110000   ENB     NIL     TDO      3.8   NIL
SQ     U2      D_SETUP   0100000   DINPN   ENB     TDO      NIL   1.9
SQ     U2      D_SETUP   0100001   MODE    ENB     TDO      4.2   3.5
SQ     U2      D_HOLD    1100000   DINPN   ENB     TDO      3.9   NIL
SQ     U2      D_HOLD    1101001   MODE    ENB     TDO      NIL   2.3
```

Fig.8

```
U6_SD:D1  U6_ZD:D0  1.1
U6_SD:D0  U6_ZD:D1  2.1
U3_ZD:D1  U2_CPD:D1 U2_S2D:D1 U2_QD:D0 3.2
U3_ZD:D1  U2_CPD:D1 U2_S2D:D0 U2_QD:D1 2.9
U3_ZD:D1  U2_CPD:D1 U2_S2D:D1 U2_S3D:D0 U2_QND:D1 1.9
U3_ZD:D1  U2_CPD:D1 U2_S2D:D0 U2_S3D:D1 U2_QND:D0 3.8
U2_DND:D0 U2_M2D:D1 U2_CPD:D1 U6_ZD:D0 U5_ZD:D1 -U3_ZD:D1 1.9
U2_DND:D0 U2_M2D:D1 U2_M3D:D0 -U2_CPD:D1 U6_SD:D1 U6_ZD:D0 U5_ZD:D1 -U3_ZD:D0 3.5
U2_DND:D1 -U2_DND:D0 U2_M3D:D0 -U2_CPD:D1 U6_ZD:D0 U5_ZD:D1 -U3_ZD:D0 3.9
U2_CPD:D1 -U2_DND:D1 U6_SD:D0 U6_ZD:D1 U5_ZD:D1 -U3_ZD:D1 -U3_ZD:D0 3.5
U2_CPD:D1 -U2_DND:D1 U6_SD:D1 U6_ZD:D0 U5_ZD:D0 -U3_ZD:D0 2.3
```

Fig.9

```
MODULE      BSCN2_VRL"XXXX";
INPUTS      DINPN     "CAP=XXXXX",
            ENB       "CAP=XXXXX",
            MODE      "CAP=XXXXX",
            SETN      "CAP=XXXXX",
            SHIFT     "CAP=XXXXX",
            TCK       "CAP=XXXXX",
            TDI       "CAP=XXXXX",
            UPDATE    "CAP=XXXXX",
OUTPUTS     DOUT      "CAP=XXXXX,
                       RPRN=(XXXXX, XXXXX),
                       DELPATH=(XXXXX),
            TDO       "CAP=XXXXX,
                       RPRN=(XXXXX, XXXXX),
                       DELPATH=(XXXXX)";
LEVEL       CELL;
DELAYS      U3_CD     "D1D0=( 1.70,  0.00)",
            U6_SD     "D1D0=( 1.60,  2.10)",
            U5_ZD     "D1D0=( 3.75,  0.00)",
            U2_CPD    "D1D0=( 0.20,  0.00)",
            U2_DND    "D1D0=( 0.00,  0.05)",
            U2_S2D    "D1D0=( 0.00,  1.00)",
            U2_S3D    "D1D0=( 0.90,  0.00)",
            U2_QD     "D1D0=( 0.00,  1.30)",
DEFINE      Z24     = ZAN      (ENB,TCK)/U3_ZD/        ;
            Z26     = ZMUX     (UPDATE,TDO,Z28)        ;
            Z27     = ZNAN     (Z26)                   ;
            Z28     = ZNAN     (SETN,Z27)              ;
            Z29     = ZNAN     (Z28)                   ;
            Z30     = ZAN      (MODE)/U6_SD/           ;
            Z31     = ZMUX     (Z30,DINPN,Z29)         ;
            DOUT    = ZNAN     (Z31)                   ;
            Z34     = ZMUX     (SHIFT,DOUT,TDI)        ;
            Z35     = ZNAN     (Z34)/U5_ZD/            ;
            Z36     = ZAN      (Z24)/U2_CPD/           ;
            Z37     = ZNAN     (Z35)/U2_DND/           ;
            Z38     = ZMUX     (Z36,Z37,Z40)           ;
            Z39     = ZNAN     (Z38)                   ;
            Z40     = ZNAN     (Z39)                   ;
            Z41     = ZMUX     (Z36,Z43,Z39)           ;
            Z42     = ZNAN     (Z41)/U2_S2D/           ;
            Z43     = ZNAN     (Z42)/U2_S3D/           ;
            Z44     = ZNAN     (Z42)/U2_QD/            ;
            TDO     = ZNAN     (Z43)                   ;
END         MODULE;
```

Fig.10

METHOD AND SYSTEM FOR CREATING AND VERIFYING STRUCTURAL LOGIC MODEL OF ELECTRONIC DESIGN FROM BEHAVIORAL DESCRIPTION, INCLUDING GENERATION OF LOGIC AND TIMING MODELS

CROSS-REFERENCE TO RELATED APPLICATIONS

This is a continuation-in-part of commonly-owned, copending U.S. patent application Ser. No. 08/085,658, filed Jun. 30, 1993 by BAIR, et al., which is a continuation of commonly-owned, Ser. No. 07/684,668, filed Apr. 12, 1991 by BAIR, et al. (now U.S. Pat. No. 5,278,769); and this is also a continuation-in-part of commonly-owned, copending U.S. patent application Ser. No. 08/054,053, filed Apr. 26, 1993 by DANGELO, et al. (status: pending), which is a continuation of U.S. patent application Ser. No. 07/507,201, filed Apr. 6, 1990 by DANGELO, et al. (now U.S. Pat. No. 5,222,030); and this is also a continuation-in-part of commonly-owned, copending U.S. patent application Ser. No. 08/077,294, filed Jun. 14, 1993 by ROSTOKER, DANGELO, et al.

TECHNICAL FIELD OF THE INVENTION

The present invention relates to techniques associated with the design and implementation of complex electronic systems, and more particularly the automatic generation of simulation models, especially for digital logic circuits.

BACKGROUND OF THE INVENTION

In the design of modern electronic systems, it is increasingly common for large blocks of circuitry to be incorporated into custom integrated circuits known as ASICs, or Application Specific Integrated Circuits. These circuits are typically designed with the assistance of computer-aided engineering (CAE) tools. The actual process of design is such that the designer will use a graphics-based workstation to "draw" schematics of a circuit on the workstation's display screen. This is accomplished by positioning and interconnecting a number of pre-defined circuit elements. Such circuit elements are represented on the display screen by schematic symbols, but also have further, lower level circuit representations associated with them. For example, a logic AND gate may be represented on the designer's display screen as a three terminal device having two inputs and one output. At a lower level, however, there is a representation of that AND gate in the form of a transistor circuit comprising transistors, resistors, etc. It is in this form, that the circuit will actually exist on an integrated circuit when it is completed.

In order for a designer to be certain that his circuit will perform correctly when it is transformed into an ASIC, it is essential that accurate circuit simulation capability be available during the design process. Such simulations must take into account circuit delays, timing dependencies, loading characteristics, and layout induced effects such as parasitic capacitances, etc. These simulations are usually provided in the form of logic and timing models, which allow the designer to closely approximate the performance of his circuit when it is subjected to the stimuli that he specifies. The more accurate the simulation models, the higher the designer's confidence level that the circuit will perform as planned.

A number of tools exist which facilitate the task of ASIC design. Among these are a number of different types of simulators. Each type of simulator operates on a circuit description at a different level of abstraction.

The lowest level simulator is a circuit simulator. One such simulator is SPICE, available under a number of trade names from a number of different vendors. SPICE is a "standard" simulator, which has grown into a de-facto industry standard over a number of years. All SPICE simulators model circuits and their interconnections in the same way, and as such produce very similar results. One commercially available SPICE simulator is HSPICE, produced by Meta-Software Incorporated.

Circuit simulators, such as SPICE and its many variants, model a circuit in very great detail. All circuit elements are modeled in an analog fashion, and transistor models are very complete, taking into account many of the actual physical characteristics of the device. Voltages and currents are modeled as continuously variable entities, rather than the simple one-zero modeling of digital simulators. As a result, circuit-level model results are extremely accurate and highly representative of the performance of actual circuits. Very accurate information about propagation delays and effects of loading, parasitic capacitances, etc., may be derived from circuit-level simulators. Unfortunately, the extreme level of detail used in circuit-level simulation requires a very large number of calculations and restricts their practical use to smaller circuits, or where extremely detailed and accurate information is required.

Switch-level simulators attempt to provide fairly detailed and accurate simulations of digital circuits by modeling all of the transistors in a circuit as switches which may be either closed or open. While this type of model does not deal well with the effects of transistor parameters, for many types of digital logic it provides a reasonably accurate approximation with significantly fewer calculations required than for circuit-level simulators. As a result, fairly detailed and accurate simulation results may be obtained in far less time than is required for circuit level simulation. One commercially available switch-level simulator is TIMEMILL, produced by EPIC Design Technology, Incorporated.

Gate-level simulators are one level of abstraction further away from the circuit than switch-level simulators. Such simulators model a circuit as a group of interconnected logic gates. The logical functions are simple enough to perform, but propagation delays and timing relationships are handled in the form of lumped parameters. Some such simulators will attempt to account for the approximate effects of loading by applying simple equations for propagation delay where the delay is a function of the number of connections. Further, parameters may be passed back from detailed simulations whereby the effects of parasitic capacitances may be approximated, again in the form of a lumped parameter. Gate-level simulators run extremely fast compared to either circuit-level or switch-level simulators, due to the smaller number of calculations required. Provided that the lumped parameters are calculated properly, gate level simulators can provide very reasonable approximations of actual circuit performance. LSI Logic and Mentor Graphics are both commercial sources of gate-level simulators.

One other tool which is commonly made available by vendors of CAE stations and software is timing verification. Timing verification is performed by software which analyzes the timing relationships between logic state changes within a circuit and determines if certain timing criteria such as minimum set-up and hold times have been violated.

Timing verifiers do not attempt to model the circuit as it would operate, but rather attempt to analyze the circuit's behavior in the form of relative delays, and cause and effect relationships within a circuit.

Because of the size and complexity of circuits which are commonly put into ASICs, it is essential to the designer that circuit simulations run fast. For this reason, logic simulation of ASICs by the designer is performed almost exclusively through the use of gate-level simulators. In order for gate-level simulation to provide reasonably accurate approximations of actual circuit performance, a fairly extensive process of analysis, simulation and model preparation is required of the tool vendor.

The process of generating logic and timing models for a new circuit element, e.g., gate, flip-flop, adder, etc., is typically a lengthy, labor-intensive process whereby schematics are drawn at both the logic-level and circuit-level. A circuit-level model is generated from the circuit-level (transistor circuit) schematic by means readily available in the present art, usually automatically. The logic circuit and transistor circuits are then analyzed to determine what stimuli should be applied to the circuit level model to arrive at simulation results which will give best indication of the delay characteristics of the circuit. The circuit is laid out and an analysis is performed to determine the effect of adjacent wire runs, etc., on the overall performance of the circuit. The circuit-level simulation is run under several different simulated conditions of power supply voltage and temperature to determine worst and best case delay characteristics, rise and fall times, etc.

The simulation results are examined to determine from the difference in time between critical stimuli and output transitions what values of propagation delay, etc., should be used for the purpose of logic modeling. The logic diagram is annotated with these values in the form of attributes which can be read and acted upon by a logic simulator. Layout induced effects are taken into account, the delay values are altered accordingly, and the logic model is complete.

Timing verification models are usually generated manually based upon data derived from the simulation run and also on knowledge of circuit function and topology. Some logic simulators, such as MDE from LSI Logic Incorporated, combine the functions of logic simulation and timing verification into a multi-mode modeler.

Once a model has been generated, it is common practice to compare the results of circuit-level, switch-level, and gate-level simulations to verify that the results track one another closely. This process is known as model verification. If the models do not track closely enough, the user of a logic simulator will not get accurate representations of the performance of his design, reducing overall confidence that the circuit will perform correctly when it is incorporated into an ASIC.

In the present art, all of the aforementioned simulation, analysis, and parameter extraction operations are performed manually by human operators. Very often, many different people perform different steps in the process, due to the many sets of skills required.

Because of the labor-intensive nature of logic/timing model generation and because of the rapid rate of change in the field of digital electronics, it becomes extremely desirable to have a method of automating the process so that accurate logic and timing models may be generated quickly enough to keep up with the needs of the design community, without requiring large, dedicated, highly-trained staffs.

In the foregoing discussion, it was noted that various levels of simulation can be performed at various levels of abstraction. Some of the levels discussed included circuit-level simulation, switch-level simulation and gate-level simulation. Each type of simulation models an electronic design at a different level of abstraction. Circuit-level simulation, which is the most detailed of those discussed hereinabove, models an electronic design in terms of its smallest components, transistors. Switch-level simulation moves a level of abstraction away from the circuit-level by modeling transistors as idealized switches (a fair approximation for logic circuits). Gate-level simulation describes an electronic design as a series of interconnected logic functions.

Further levels of abstraction are possible. For example, it is possible to model a digital electronic design in terms of its "behavior". That is, a digital electronic design can be described in terms of its response to external stimulus, i.e., its behavior. Present day state-of-the-art design technique, logic synthesis, is really only a mapping between different levels of physical abstraction.

One of the most difficult problems in design automation is the inability to get timing closure at even the gate level effectively. This forces designers to do two designs: logic design and timing design. Otherwise, the designer simply over-designs the circuits, because the best case timing is much different from the worst case timing. In other cases, designers insist on control of device layout so that they can evaluate all of the tradeoffs between implementation and timing.

Present computer aided design (CAD) systems for the design of electronic circuits, referred to as ECAD or Electronic CAD systems, assist in the design of electronic circuits by providing a user with a set of software tools running on a digital computer with a graphical display device. Typically, five major software program functions run on the ECAD system: a schematic editor, a logic compiler, a logic simulator, a logic verifier, and a layout program. The schematic editor program allows the user of the system to enter and/or modify a schematic diagram using the display screen, generating a net list (summary of connections between components) in the process. The logic compiler takes the net list as an input, and using a component database puts all of the information necessary for layout, verification and simulation into a schematic object file or files whose format(s) is(are) optimized specifically for those functions. The logic verifier checks the schematic for design errors, such as multiple outputs connected together, overloaded signal paths, etc., and generates error indications if any such design problems exist. The logic simulator takes the schematic object file(s) and simulation models, and generates a set of simulation results, acting on instructions initial conditions and input signal values provided to it either in the form of a file or user input. The layout program generates data from which a semiconductor chip (or a circuit board) may be laid out and produced.

The Modular Design Environment (MDE) produced by LSI Logic Corporation of Milpitas, California, is a suite of software tools for computers running the UNIX operating system. MDE comprises a schematic editor (LSED) and a simulator (LDS), among other software programs, and provides an example of commercially available tools of the aforementioned type. Another example of a schematic editor, schematic compiler, and schematic simulator may be found in the SCALDstation produced by Valid Logic Systems, Inc. of Mountain View, Calif.

VHDL, or VHSIC (Very High Speed Integrated Circuit) Hardware Description Language, is a recently developed, higher level language for describing complex devices. The form of a VHDL description is described by means of a context-free syntax together with context-dependent syntactic and semantic requirements expressed by narrative rules. VHDL is described in *IEEE Standard VHDL Language Reference Manual* (IEEE Std 1076-1987), and is also known as MIL-STD-454, Regulation 64.

VHDL represents an important step forward in design specification languages because the semantics, or intent, of the language constructs are clearly specified. In theory, VHDL unambiguously describes a designer's intended system or circuit behavior, in syntactic terms. The "design entity" is the primary hardware abstraction in VHDL. It represents a portion of a hardware design that has well-defined inputs and outputs and performs a well-defined function. A design entity may represent an entire system, a sub-system, a board, a chip, a macro-cell, a logic gate, or any level of abstraction in between. A "configuration" can be used to describe how design entities are put together to form a complete design.

VHDL supports three distinct styles for the description of hardware architectures. The first of these is "structural" description, wherein the architecture is expressed as a hierarchical arrangement of interconnected components. The second style is "data-flow" description, in which the architecture is broken down into a set of concurrent register assignments, each of which may be under the control of gating signals. This description subsumes the style of description embodied in register transfer level (RTL) descriptions. The third style is "behavioral" description, wherein the design is described in sequential program statements similar to a high-level programming language. In the main hereinafter, the behavioral description style is discussed. However, all three styles may be intermixed in a single architecture.

A methodology for deriving a lower-level, physically-implementable description, such as a RTL description of the higher level (e.g. VHDL) description, via an intermediate rule-based tool such as Prolog, is disclosed herein.

Prolog is a programming language based on predicate logic. It can be used for "intelligent" tasks like mathematical theorem proving. A Prolog program is a set of rules which define the relationships among objects. The general form of a Prolog rule is a "horn" clause, in which a specified "goal" is true if certain conditions are true. Execution of a Prolog program involves finding a proof for the goal in question, using unification and resolution. An important aspect of Prolog employed in the present invention is "term_expansion", which converts pre-defined rules into ordinary Prolog clauses.

SUMMARY OF THE INVENTION

In accordance with the present invention, an automatic logic-model generation system operates on a behavioral description of an electronic design (e.g., a circuit, a system, etc.) to automatically generate a low-level (i.e., circuit-level) design of the electronic design, to lay out the electronic design for production in the form of an integrated circuit, and to produce logic-level models incorporating accurate timing (and delay) information. A verification process is also performed whereby the logic-level model is automatically verified for accuracy.

It is therefore an object of the present invention to provide a means for automatic generation of logic models by using the schematic data base of an arbitrarily chosen schematic capture system.

It is a further object of the present invention to provide means for providing an arbitrarily chosen circuit-level (or transistor-level) simulator with appropriate input stimuli to establish timing-related parameters by automated examination and analysis of circuit topology and function.

It is a further object of the present invention to provide means for automatic extraction of timing-related parameters from said circuit-level simulation results.

It is a further object of the present invention to incorporate those automatically extracted timing-related parameters into logic and timing models by automatic means.

It is a further object of the present invention to provide a means of automatic verification of the functional and timing accuracy of the generated models.

It is a further object of the present invention to provide a methodology for deriving a valid structural description of a circuit or system from a behavioral description thereof, thereby allowing a designer to work at higher levels of abstraction and with larger, more complex circuits and systems.

It is a further object of the present invention to provide a technique for automatically translating behavioral descriptions of a circuit or system into physical implementations thereof.

It is further object of the invention to raise the level of design validation from a structural (net list) level to a behavioral level.

It is a further object of the invention to provide a more standardized design environment, thereby alleviating the need for cross-training between different design platforms and allowing resources to be directed more towards synthesis and testability.

It is a further object of the invention to provide a technique for automatically generating highly-accurate logic and timing models for electronic designs derived from a behavioral description.

According to the invention, there is an integrated circuit design environment including a schematic capture station, a logic simulator, timing verifier, and circuit simulator. The hardware of such design environments generally minimally comprises a computer, keyboard, graphic display means (such as a color graphic CRT display system), and graphic input means (such as a mouse or a digitizing tablet). Generally the hardware would be based upon a commercially available computer workstation, such as those provided by Sun Microsystems or by Apollo Computer Incorporated, and the software of the design environment would be provided as an integrated set of tools by one manufacturer, such as the design environments provided by LSI Logic Incorporated or Mentor Graphics Incorporated. A logic schematic is prepared on the schematic capture station, for which an accurate logic simulation is desired, and from which a net-list is prepared. A net-list is a file comprising descriptions of the logic primitives (e.g., AND/OR gates, etc.) used in the logic schematic and the interconnections therebetween. This is generally accomplished automatically by the schematic capture system upon completion of the logic schematic, although some systems may require an additional step of logic compilation, whereby the user invokes a program to perform the process of conversion of the graphical schematic data to a net-list. In any case, the capability of net-list generation is widely known and implemented in all present schematic design environments.

At the top level, according to the invention, there is a control program which runs all of the other programs in the appropriate sequence, directing to those programs the requisite files and data structures. This top-level program operates according to the process flow in the following description.

In the present invention, a series of programs are run which invoke, operate on the data from, and integrate the capabilities of a number of existing design tools (simulators, data analysis, etc.). These programs operate on the logic schematic data base prepared by the user, prepare input files for the existing tools, invoke the existing tools, analyze the output files thereof, and ultimately combine the outputs of the existing tools into useful logic models. The end result is the appearance to the user of an automatic process of logic model generation. This process of input file preparation and output file analysis would ordinarily be performed by human operators, often by many different people due to the different skill levels required at each step.

After the net-list has been prepared, one program of the current invention analyzes the logic schematic, via the net list, for all of the possible paths from primary inputs to outputs, ultimately producing a list of input-to-output paths where a change of state an the input will effect a change of state at the output, and the input patterns under which those state changes will be effected. Such patterns and dependencies will include a prerequisite sequence of events in the case of sequential circuits, whereas combinational circuits will require only a static description of the states of the other inputs. This analysis is performed by a graphic-walking algorithm, which is a form of reachability analysis; a technique which is well known in the present art. This program's output is designed so that the format of the output data will be in the form of a stimulus file for the circuit-level simulator of the design environment. Since the choice of design environment is entirely arbitrary, and hence the choice of circuit simulator is entirely arbitrary, the exact format of the output will vary from implementation to implementation. Similarly, the input (net-list) format will be dependent upon the specific design environment chosen. As such, the process of net-list interpretation into an internal representation of circuit connectivity will vary from implementation to implementation. In any case, however, the internal process of reachability analysis remains unchanged.

In order to simplify the process of input-to-output path determination, delay paths for sequential logic elements, e.g., latches and flip-flops, are pre-defined according to the known characteristics of circuits with their topology. This greatly reduces the amount of computer analysis required for delay path identification.

Also after the net-list of the logic schematic (or logic-level schematic) has been prepared, a transistor-level schematic (or circuit-level schematic) is prepared corresponding to the logic-level schematic. This schematic represents the same circuit, but at a level where all circuit blocks in the logic circuit are represented by their actual transistor circuits. This transistor-level schematic is prepared using the existing tools on the integrated circuit design station. Depending upon the exact integrated circuit technology in use, the exact form of this circuit representation of the logic schematic may vary widely. For example, there are very significant differences between the transistor-level circuits of the same logic circuit in NMOS and CMOS technologies. Differences also exist in the transistor-level circuits and implementations of the same logic circuit even when similar CMOS technologies are implemented by different manufacturers.

In general, the transistor-level schematic diagram is generated either automatically or semi-automatically by the software of the integrated circuit design workstation. In some cases, where highly optimized, highly customized circuits are being designed, the transistor-level circuit will be generated manually or modified from automatically generated transistor-level schematics by an operator or operators with special knowledge of the characteristics of the integrated circuit manufacturer's particular process in use. Similarly, the layout process (process of arranging the transistors and passive components for placement on an integrated circuit) may be either automatic, semi-automatic, or manual, for similar reasons.

After layout, an automated process of analysis is performed, whereby the layout of the circuit is analyzed for parasitic capacitances between adjacent signal runs, etc., and a list of layout-related circuit parameters is generated. This set of layout-related circuit parameters is then used to modify the transistor-level schematic so that circuit equivalences of the parasitic effects are incorporated into the circuit simulation. This process is accomplished automatically in many manufacturers' modern integrated circuit design software, and is well known in the present art.

In a manner similar to that used for the logic-level schematic, a net-list is generated for the circuit-level schematic. This net-list is translated into a circuit-description format usable by the circuit-level simulator. Circuit-descriptions are separately generated for each primitive (e.g., NAND, NOR, D-FLOP, etc.) in the circuit. Automatic means for this translation are provided as part of most modern integrated circuit design environments. The translation process is a relatively straight-forward formatting process and is well known in the present art. One suitable such simulator is HSPICE, produced by Meta Software Incorporated, typical of SPICE simulators widely used in the present art. The simulator operates on the transistor-level circuit description according to the input stimulus data previously prepared from the reachability analysis of the logic-level circuit and produced outputs representing the transistor-level circuit's response to that input stimulus. The simulator's output is examined at critical transition points and delay and timing parameters are extracted.

Next, a set of simultaneous equations representing the multiple contributors to delay for each path are generated and solved according to an existing mathematical technique known in the art as the "SIMPLEX" method, whereby optimal values are determined. For the purposes of this analysis, "optimal" means minimum error magnitude in the delay value associated with each primitive.

The process of running the simulator and extracting delay parameters is performed automatically in LSI Logic Inc.'s integrated circuit design environment by a program called "CHARMS", which runs the HSPICE program, providing it with the necessary input files, and analyzes the outputs for input-to-output delay and timing parameters.

The delay values generated in the "SIMPLEX" analysis process are applied directly to a timing model, the input and output dependencies for which were already determined as a part of the reachability analysis. The timing model generation process is simply a format translation problem, and will vary from implementation to implementation, depending upon the particular timing verifier's model format.

The final step of model generation is generation of the completed logic model. Functional models of combinational logic circuits are already generated automatically by present integrated circuit design environments. The model generator of the present invention uses this same process, but applies the delay information derived from the circuit-level simulations and "SIMPLEX" analysis to the primitives so that very accurate logic models are created.

In order to verify the timing accuracy of the model, a verification step is performed whereby the input stimuli used for the circuit-level simulation are converted to a format usable by the logic-level simulator and are applied to the newly created logic model. The resultant outputs from the logic-level simulator are compared with the outputs from the circuit-level simulator, and if the output transitions from the two simulations do not deviate by more than some predetermined amount, then the logic model is said to be accurate and is ready for use. In the rare case of significant deviation, manual alteration of the logic and timing models will be required.

The amount of deviation which will be permitted (error tolerance) between simulations is determined on an implementation by implementation basis, based upon the known overall accuracy of the simulators and their methods of calculation. Another criterion in the selection of the error tolerance is the level of accuracy in logic simulations required by the system, technology, or user.

One final model verification step is performed, whereby the results of the different simulation runs are compared for functional accuracy. This is significantly different from the timing verification step, where the output of the circuit level simulator and the logic-level simulator are compared for timing compatibility. The functional verification step ensures that the model behaves in the same way at all levels: logic-level, switch-level, and circuit-level.

According to an aspect of the invention, there is provided an electronic CAD system operated with a suite of software tools for enabling a designer to create and validate a structural description and physical implementation of a circuit or system (hereinafter, "device") from a behavior-oriented description using a high-level computer language. The methodology includes the following steps:

First, the designer specifies the desired behavior of the device in a high-level language, such as VHDL. The description includes high-level timing goals.

Next, in a "behavioral simulation" step, starting with the VHDL behavioral description of a design, the designer iterates through simulation and design changes until the desired behavior is obtained.

Next, in a "partitioning" step, the design is partitioned into a number of architectural blocks. This step is effectively one of exploring the "design space" of architectural choices which can implement the design behavior. Links to the physical design system enable high level timing closure by constraining the feasible architectural choices to those which meet the high-level timing and area (size) goals. This is a key step because it represents the bridge between the conceptual level and the physical level. A second function of this step is to direct the various architectural blocks to the appropriate synthesis programs.

Next, in a "logic synthesis" step, a number of separate programs are used to efficiently synthesize the different architectural blocks identified in the partitioning step. Those blocks having highly regular structures or well understood functions are directed to specific synthesis tools (e.g. memory or function compilers). Those blocks with random or unstructured logic are directed to more general logic synthesis programs. The output of this step is a net list of the design.

Next, in a "physical simulation" step, the gate-level design description is simulated, comparing the results with those from the initial behavioral simulation. This provides a check that the circuit implementation behaves as intended, and that the timing goals are achieved.

Optionally, the design is back-annotated to ensure that other physical design limitations, such as capacitive loads and parasitics, are not exceeded.

Finally the design is input to existing software systems which control the physical implementation of the design, such as in an ASIC (Application Specific Integrated Circuit) device.

An important feature of the present invention is that, as with all top-down design approaches, the foregoing is a process of architectural refinement in which design realization moves down through levels of abstraction. The characteristics of VHDL and the disclosed methodology enable this process to occur without losing the intent and meaning present at higher levels. This is the key to automating the process.

Another important feature is that the partitioning step, or partitioner, in effect, uses high-level timing information extracted from the chip floorplan to constrain the design into the feasible architectural choices which meet the high-level timing goals. These constraints are key to allowing the process to converge to specific physical embodiments.

Another important feature is that the methodology enables timing closure without going to actual layout, solving one of the most difficult problems in design automation today, namely the inability to get timing closure at even the gate level effectively which in the past has forced designers to create two designs: a logic design and a timing design. Using the methodology disclosed herein, timing closure can be obtained by using a form of back annotation which will extract timing data from floorplanning-level layouts and then incorporate this data into the I/O (Input/Output) ports of the VHDL behavioral description.

According to an aspect of the invention, the behavioral (VHDL) description of the device is interpreted by attaching one or more semantic rules to each of the syntactic rules underlying the behavioral description. This is accomplished (such as via Prolog) using a "syntax attributed tree".

According to an aspect of the invention, a model for an "automatically designed" electronic system (i.e., a system produced from a behavioral description thereof, e.g., a VHDL description) is produced in the same manner as described for a captured schematic, using the automatically-generated design description as a basis.

By applying the model generation process to automatically generated designs, the steps of schematic capture and simulation are bypassed. The captured schematic is simply a representation of an electronic design which is ultimately translated into a net list. Since net-list generation and simulation of automatically generated designs is inherent in the automated design process, the need for a schematic in the model generation process is effectively eliminated. If desired, however, the automated design process can produce "human-readable" schematics from the generated design description at any of several levels of hierarchy.

Other objects, features and advantages of the invention will become apparent in light of the following description thereof.

BRIEF DESCRIPTION OF THE DRAWINGS

FIG. 8 is a listing of the results of reachability analysis for the circuit of FIG. 6 showing the input-to-output dependencies found, their types, and input patterns.

FIG. 9 is a listing of the simulator stimuli derived from the results of reachability analysis for the circuit of FIG. 6.

FIG. 10 is a listing of a generated logic model file template for the circuit of FIG. 6, where layout-related parameters (capacitances) have not been supplied.

DETAILED DESCRIPTION OF THE INVENTION

For the purpose of an exemplary detailed description of the invention, it will be assumed that LSI Logic's integrated circuit design environment is the basis upon which automatic model generation is built. This environment includes a computer, graphic display screen, graphical input device, keyboard, schematic capture software, net-list generation software, logic simulation software, logic-level to transistor-level translation software, circuit simulation software, net-list to circuit-level simulation input conversion software, "CHARMS" software for running the circuit simulator and analyzing the results for pin-to-pin delay characteristics, as well as all software of the present invention.

Figure 1:
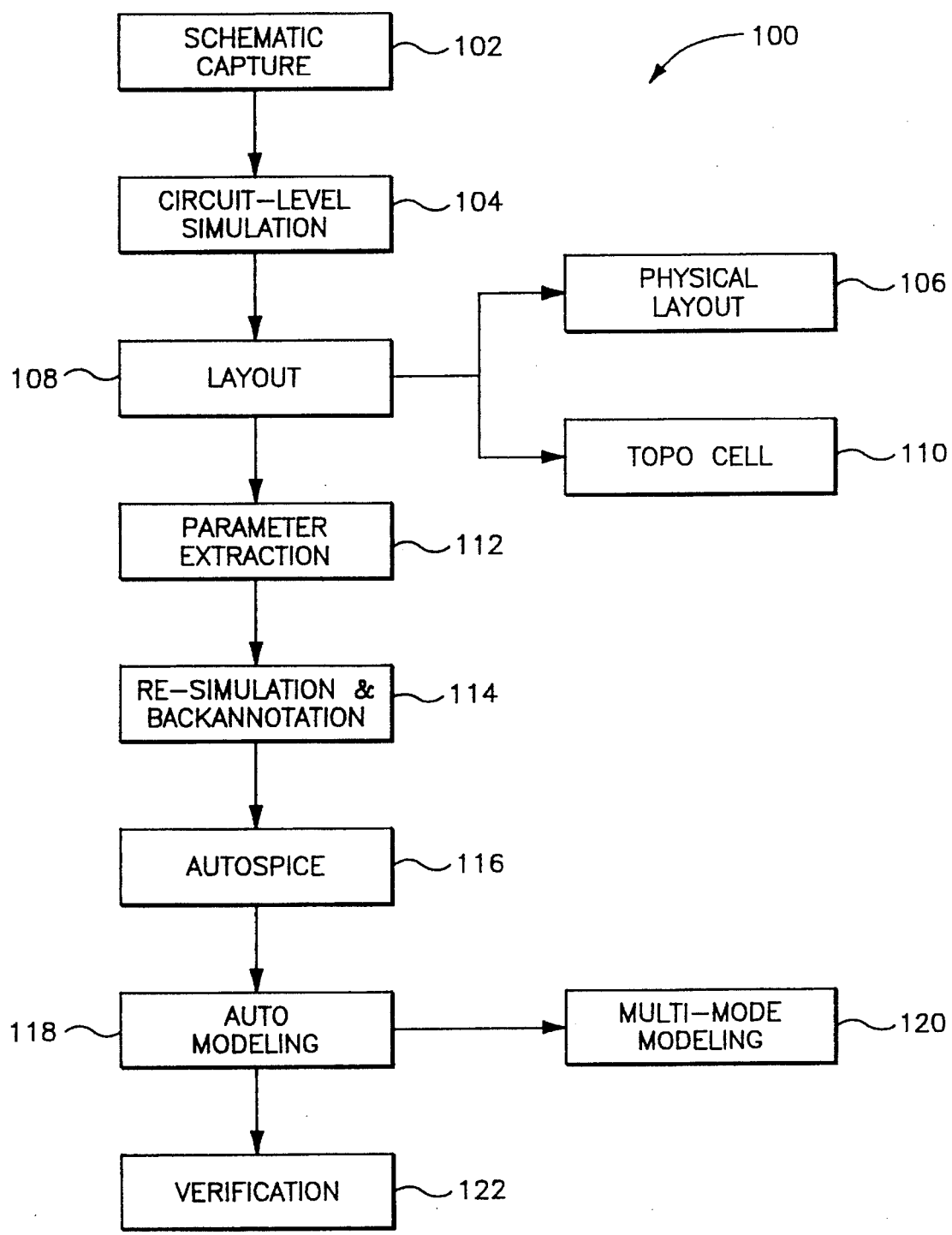
FIG. 1 is a process flow diagram showing the steps involved in the logic model generation process of the present invention

FIG. 1 shows a process flow diagram 100 detailing the steps from the beginning to the end of the model generation process. Box 102 with respect to FIG. 1 represents the schematic capture process whereby the user enters his logic diagram into the integrated circuit design environment using the schematic capture software. Box 104 with respect to FIG. 1 represents a circuit-level simulation process performed on a transistor-level representation of the user's schematic generated by the software of the integrated circuit design environment for the purpose of functional verification.

Box 108 with respect to FIG. 1 represents a physical layout process whereby the transistor-level circuit entered by the user is arranged for placement onto an integrated circuit in the form of a physical layout 106. A standard cell 110, which is a standardized library representation of the physical layout 106 may also be generated at this time.

Box 112 with respect to FIG. 1 represents a parameter extraction process whereby the layout is analyzed for its effect on the circuit and whereby the transistor-level schematic is modified to account for the effects of the layout.

Box 114 with respect to FIG. 1 represents re-simulation of the circuit to ensure proper function after compensation for layout effects.

Box 116 with respect to FIG. 1 represents a process in the LSI Logic Corp. integrated circuit design environment known as "AutoSpice" (or "CHARMS") whereby a SPICE-type simulator is invoked with a transistor-level circuit description derived from the transistor-level schematic, run according to input-stimuli generated by the software of the present invention, and the results of which simulation are analyzed and delay parameters are extracted.

Box 118 with respect to FIG. 1 represents the automatic model generating software of the present invention whereby the delay data produced in 116 are combined with other logic simulation data to create accurate logic and timing models of the user's circuit.

Box 120 with respect to FIG. 1 represents further model generation for a multi-mode simulator available in the LSI Logic Corp. integrated circuit design environment known as the "MDE" simulator. This simulator performs both logic simulation and timing verification. The creation of a model for this program is simply a matter of re-formatting separate timing and logic simulation models into a form acceptable to the multi-mode simulator.

Box 122 with respect to FIG. 1 represents the model verification process of the present invention whereby the newly created logic/timing model is run on a logic simulator and the results are compared to results obtained in circuit-level and/or switch-level simulation. If the simulations correspond accurately to one another and do not deviate by more than some pre-determined tolerable amount, the logic and timing models are said to be correct and complete.

Figure 2:
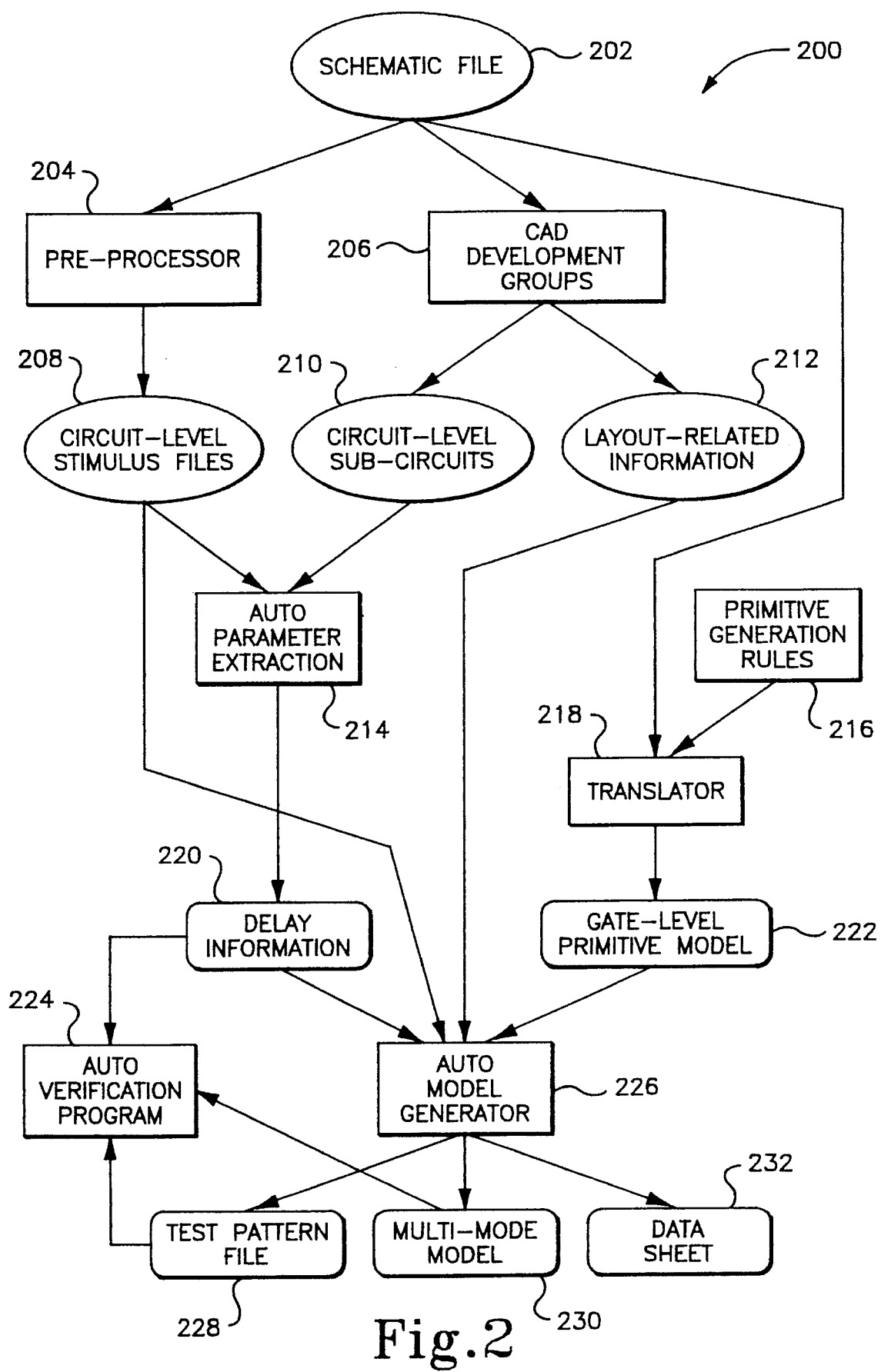
FIG. 2 is a diagram showing the data flow the logic model creation process of the present invention

The data-flow diagram 200, with respect to FIG. 2, shows the data flow through the system in the process of automatic model creation. A schematic file 202, is generated by a user. This schematic file is operated upon in three different ways:

First, one of the software components of the present invention, a translator 218 in the integrated circuit design environment software operates according to primitive generation rules 216 on the data of schematic file 202 to produce a gate-level (logic-level) model of the user's logic circuit. Depending upon the specific logic simulator which will be used in the target environment, the rules may be changed to create raw logic models for any logic simulator.

Second, operations performed by CAD development groups 206, either automatically in software or manually, result in sub-circuit descriptions 210 (transistor-level schematic) of the schematic file 202 and information related to the effects of layout on circuit performance.

Third, a pre-processor 204, one of the software components of the present invention, is run. This pre-processor performs a reachability analysis from the inputs to the outputs of the schematic file 202 and determines its input-to-output (or pin-to-pin) delay paths an the input stimulus patterns required to effect transitions along those input-to-output delay paths, producing circuit-level stimulus files 206.

A process 214, automatic parameter extraction (performed by the "CHARMS" software in the LSI Logic Corp. integrated circuit design environment) operates on the circuit level stimulus 208 and the circuit-level description 210, causing circuit-level simulations to be run. The results of those simulations are analyzed producing delay information 220.

When delay information 220, layout related information 212, and raw logic-model 222 are all available an auto-model generator 226, another software component of the present invention, combines and re-formats the data and model information of 220, 212, and 222 into a multi-mode model 230. In the case of the LSI Logic Corp. system, the model is prepared for the "MDE" simulator. In the case of other systems, other simulator model format(s) would be used. If multi-mode modeling is not available on the target system, the output of auto-model generator 226 would be broken into two discrete parts: a timing model and a logic model. In such a case, multi-mode model 230 may be considered as comprising the two component models (timing model and logic model).

Other outputs of the auto-model generator software are a test pattern file 228 and a data sheet 232. The process of generating test pattern file 228 is simply a re-formatting process whereby the circuit level stimulus files 208 are re-generated for the target logic or multi-mode simulator. Generation of data sheet 232 is also a formatting process whereby the newly established timing parameters for the logic model and the graphic representation thereof are combined into a human readable form.

An auto-verification program 224, the final software component of the present invention, operates on the delay information 220 resulting from circuit level simulation, newly created model 230, and translated test-pattern file 228 to run a comparison simulation using the new model. The results of this simulation are compared to the results of the circuit level simulation 220. If the results do not deviate by more than some pre-specified error tolerance, then the model is complete.

Figure 3:
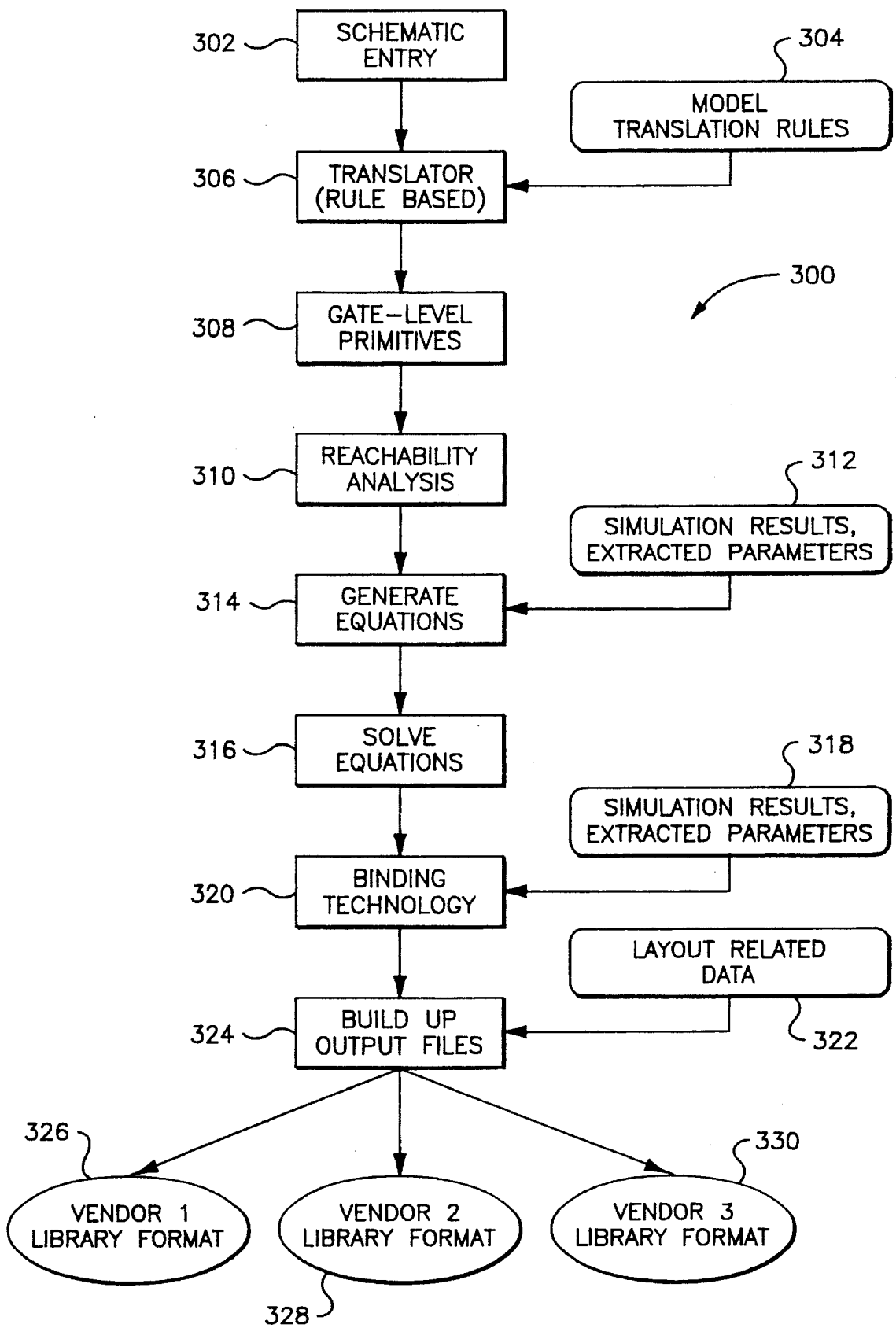
FIG. 3 is a flow diagram showing the major steps involved in the model-generation program of the present invention.

Flowchart 300 with respect to FIG. 3 represents the control flow which is implemented in the top-level program of the present invention. After schematic capture and net-list conversion 302 is complete, the rule-based translator 306 (corresponding to 218 with respect to FIG. 2) is run producing gate level primitives 308 (corresponding to 222 with respect to FIG. 2). Next, reachability analysis 310 is performed (corresponding to pre-processor 204 with respect to FIG. 2), from which the output is used to generate a set of simultaneous equations by process 314. Next, process 316 solves the simultaneous equations to produce delay data (corresponding to 220 with respect to FIG. 2). Process 312 corresponds to the combination of 214 and 220 with respect to FIG. 2. Processes 314 and 316 correspond to parts of 226 with respect to FIG. 2.

Again with respect to FIG. 3, process 320 combines all of the generated model and delay information into a useful internal representation and process 322 (corresponding to 212 with respect to FIG. 2) formats these into the appropriate output files. Processes 314, 316, 320, 322 and 324 in combination correspond to auto-model generation 226 with respect to FIG. 2. By using different sets of formatting criteria, models may be generated for different manufacturer's logic model libraries, represented by 326, 328, and 330, with respect to FIG. 3. By creating a number of different models at different levels (e.g., circuit-level, switch-level, and logic-level) more opportunities are created for model verification. The greater the number of comparisons performed by the auto-verification process, and the greater the agreement between the corresponding simulations, the greater is the confidence level that the models will perform accurately and repeatably.

Figure 4:
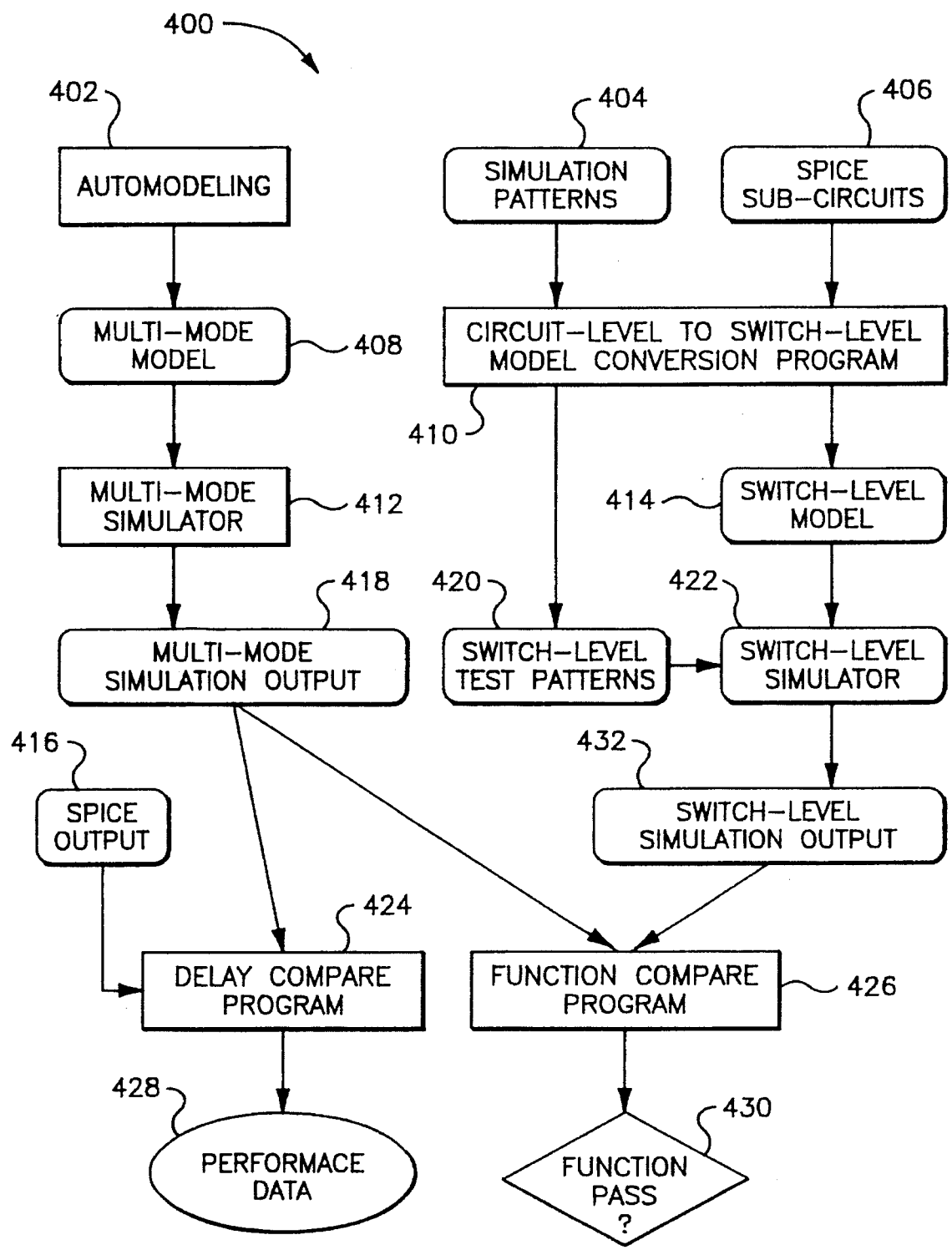
FIG. 4 is a diagram showing the data flow in the model verification process of the present invention.

Data flow diagram 400 with respect to FIG. 4 represents the process of auto-verification. Before auto-verification is performed, auto-modeling program 402 will have created a logic or multi-mode model 408, and simulation patterns 404 and SPICE (or other circuit-level model) sub-circuits 406, will have been produced in the process of auto-model generation.

A model translation process 410 incorporated into the model verification process 400 translates the circuit-level model 406 (typically a SPICE model) and circuit simulation patterns 404 into a switch-level model 414 and switch-level simulation patterns 420 which will be run on a switch-level simulator 422. A switch-level model performs functions similar to those of a circuit-level model, but the detailed, discrete transistor models are replaced with switches which can assume either an open (disconnected, or OFF) state or a closed (shorted, connected or ON) state. This type of simulator operates much faster than a circuit-level simulator, because of the significantly reduced number of calculations required due to the simplified model. This makes the switch-level simulator ideal for real-time model verification, and good for functional verification. Both the logic (or multi-mode) model 408 and the switch-level model 414 are run on the logic (or multi-mode) simulator 412 and the switch-level simulator 422, respectively, producing logic (or multi-mode) simulation output 418 and switch-level simulation output 432. The functional responses of the logic simulation 418 and the switch-level simulation output 432 are compared. If there is functional agreement (both output do the same things in response to the same stimuli) then the function pass criteria 430 are satisfied. The SPICE output 416 (circuit-level simulator) and logic (or multi-mode) simulator output 418 are compared via a delay compare program 424. Provided that delay results are adequately close, as specified by a pre-determined error tolerance, performance data 428 is generated for examination by the user.

Figure 5:
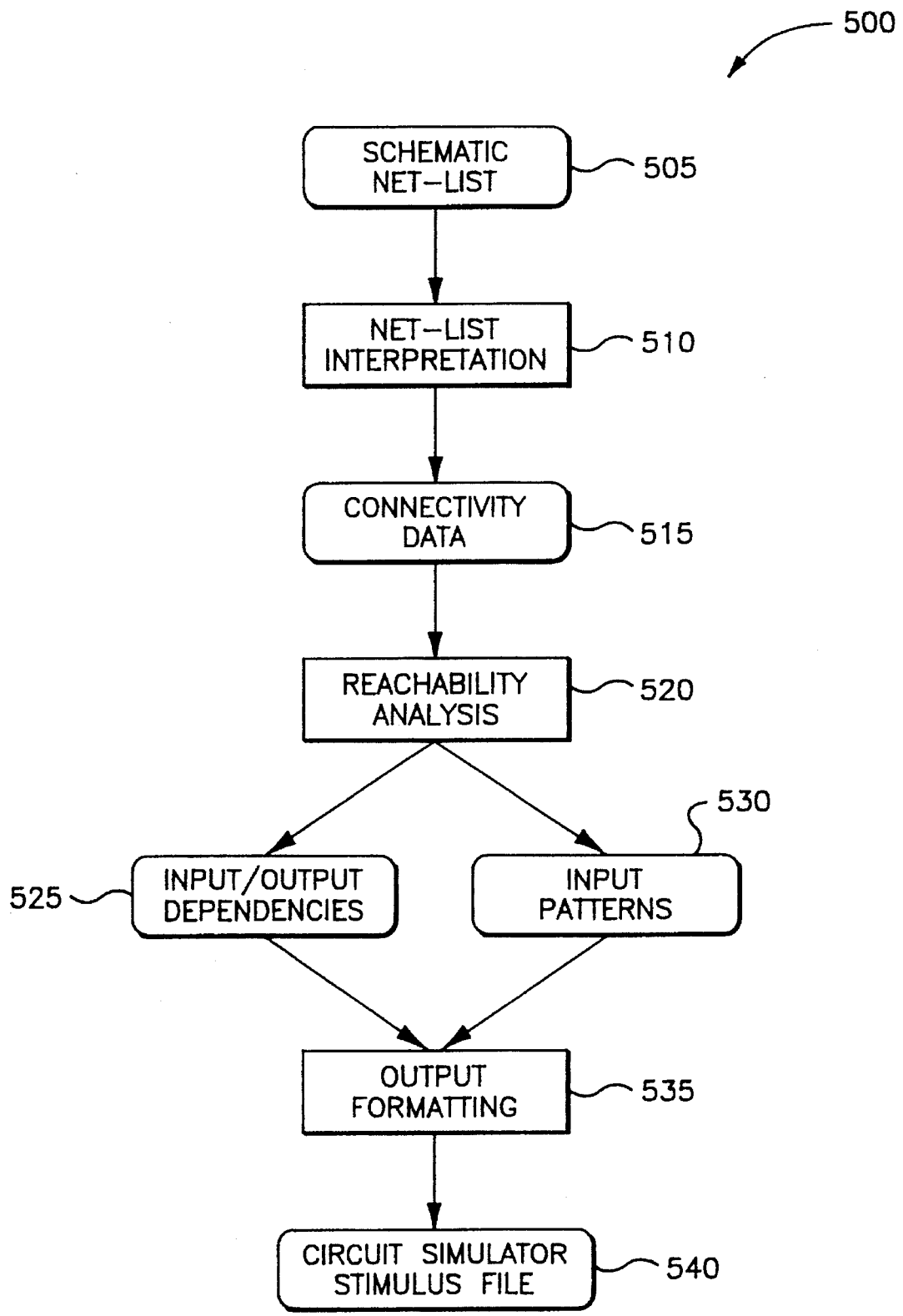
FIG. 5 is a diagram showing the data flow in the net-list analysis and stimulus file generation of the present invention.

The data-flow diagram 500 of FIG. 5 shows the operation of the pre-processor program (204 with respect to FIG. 2). A schematic net-list 505 is read and interpreted by a net-list interpretation process 510. This process produces connectivity data 515. Reachability analysis 520 is then performed on the connectivity and primitive data of 515 to determine what combinations and sequences of input patterns will cause transitions of the circuit outputs. The result of reachability analysis is a list of input-output dependencies 525 (or delay paths) and the input sequences and patterns 530 required to produce transitions according to those dependencies. An output formatting process 535 operates on the dependencies 525 and patterns 530 according to the input requirements of the circuit-level simulator in the integrated circuit design environment and produces a circuit simulator stimulus file 540.

Figure 6:
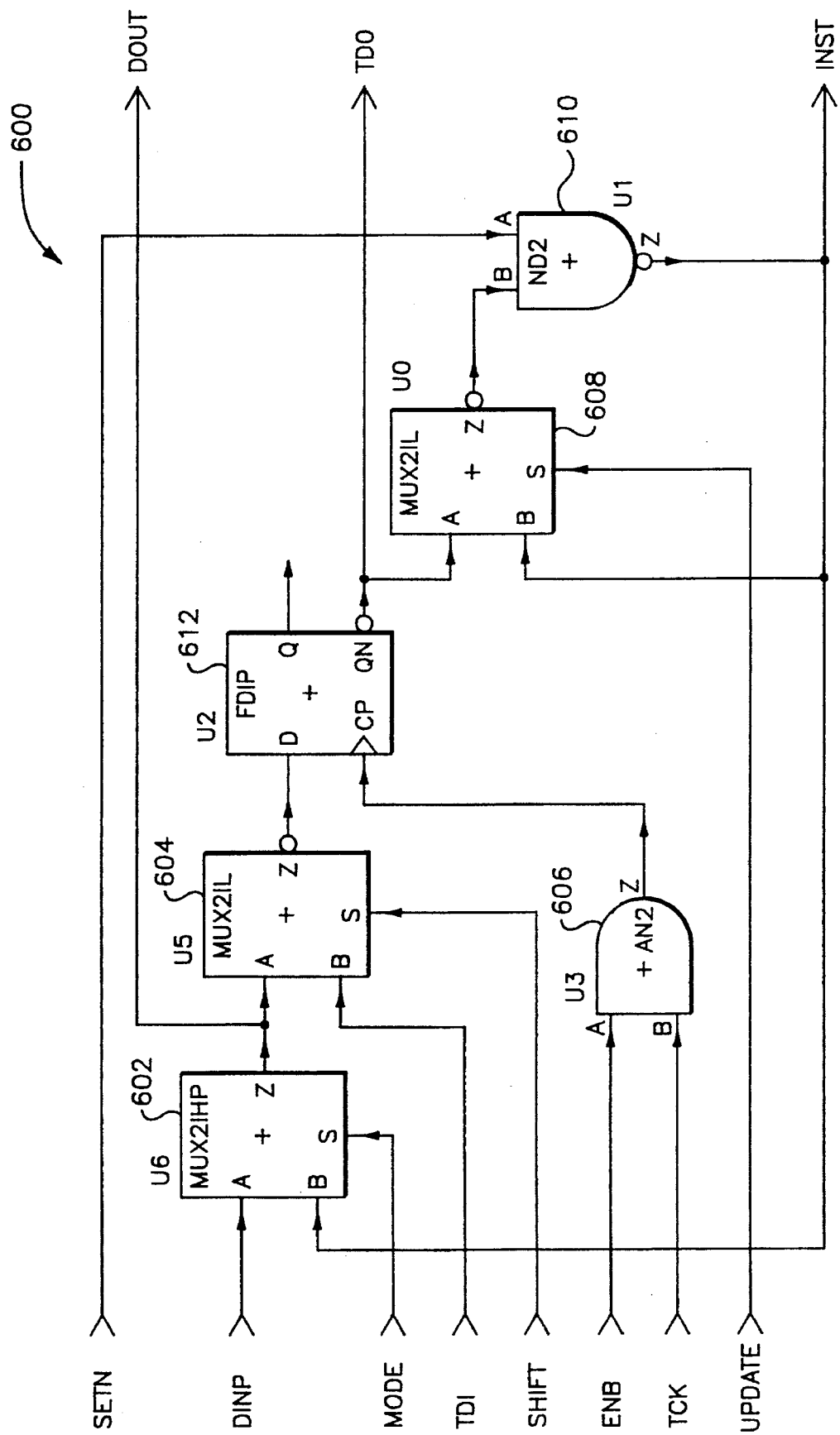
FIG. 6 is a logic-level schematic diagram of a circuit used for sample analysis in the description of the present invention.

FIG. 6 is a schematic diagram of a logic circuit 600 to be operated on by the model generation system of the present invention. The circuit comprises combinational logic elements 602, 604,606, 608 and 610, and sequential logic element 612 and interconnections therebetween.

Figure 7:
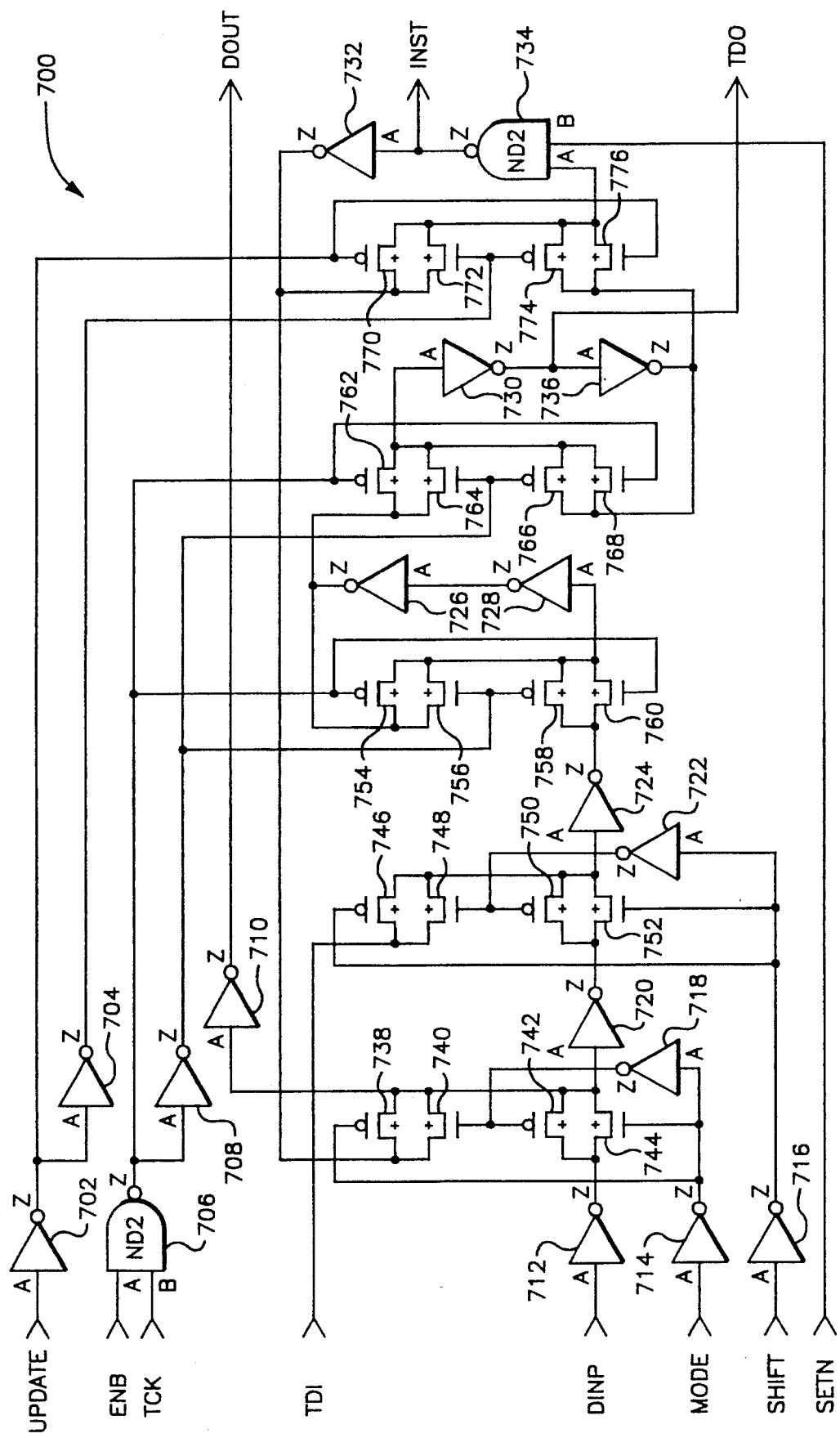
FIG. 7 is a partial transistor-level representation of the logic-level schematic of FIG. 6 where the sequential element has been replaced with its transistor and primitive components.

FIG. 7 is a schematic diagram 700 of the result of reducing the logic circuit 600 with respect to FIG. 6, into its logic primitive and transistor subcomponents. The circuit 700 includes logic primitives 702, 704, 706, 708, 710, 712, 714, 716, 718, 720, 722, 724, 726, 728, 730, 732, 734, and 736, and transistors 738, 740, 742, 744, 746, 748, 750, 752, 754, 756, 758, 760, 762, 764, 766, 768, 770, 772, 774, and 776.

FIG. 8 is listing of the results of reachability analysis (i.e., circuit simulator stimulus file 540 with respect to FIG. 5) of the schematic of FIG. 7 showing cell type (CB=combinational, SQ=sequential), parameter names, input pattern, and input/output relationships.

FIG. 9 is a listing of an equations file, (i.e., 314 with respect to FIG. 3) created by reformatting the results of reachability analysis according to appropriate simulator input requirements, and delay information (i.e., delay information 220 for auto parameter extraction 214 with respect to FIG. 2).

FIG. 10 is a listing of a logic simulator model source file (i.e., 230 with respect to FIG. 2) listing the appropriate delays, primitives, and timing relationships between pins. These results were derived from the auto-model generator (i.e., 226 with respect to FIG. 2).

Figure 11:
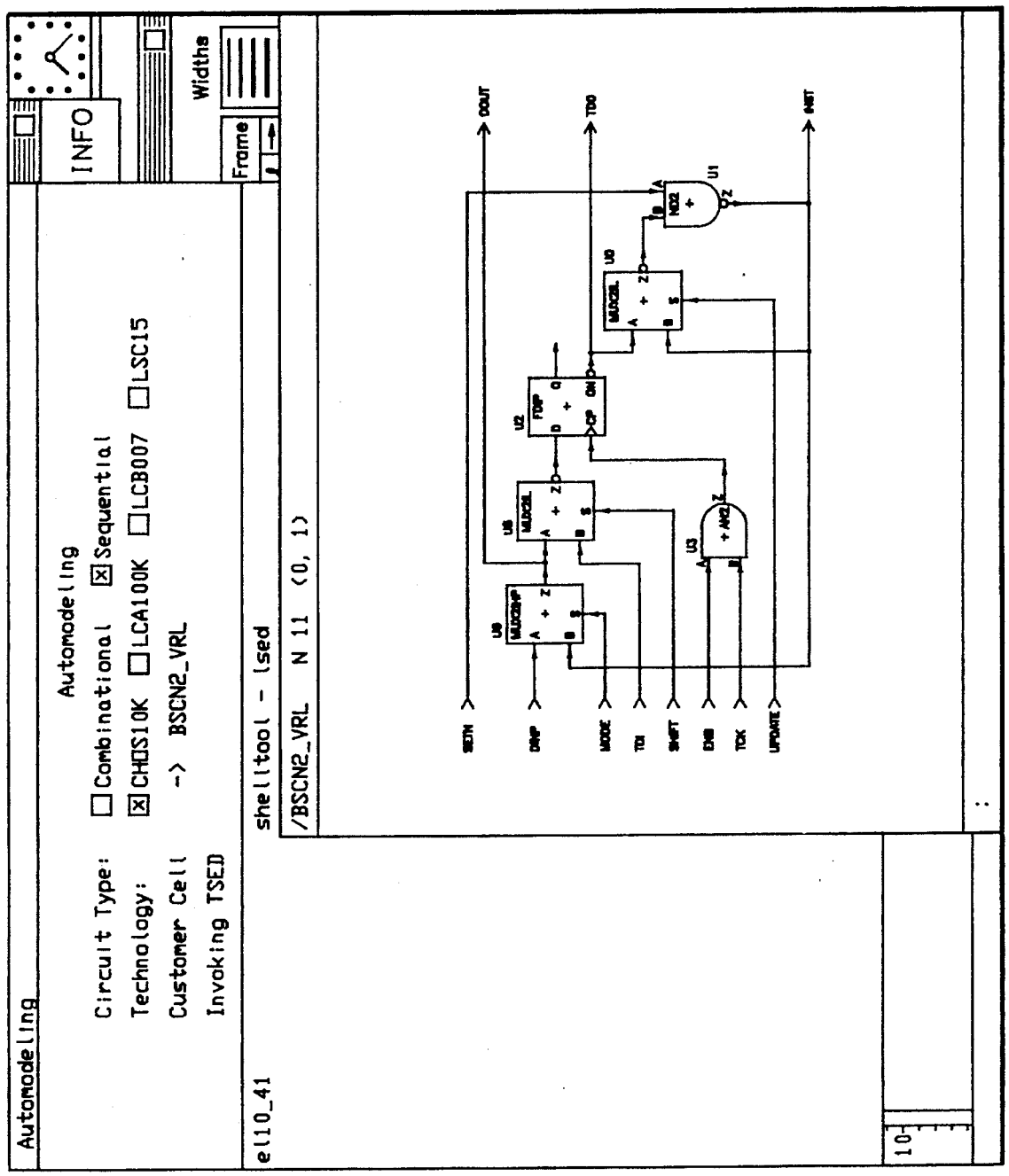
FIG. 11 is a display screen representation of the user's view of the system during model generation for the sequential portions of the circuit.

FIG. 11 is a display screen representation of the user's view of the system during model generation for the sequential portions of the circuit.

Figure 12:
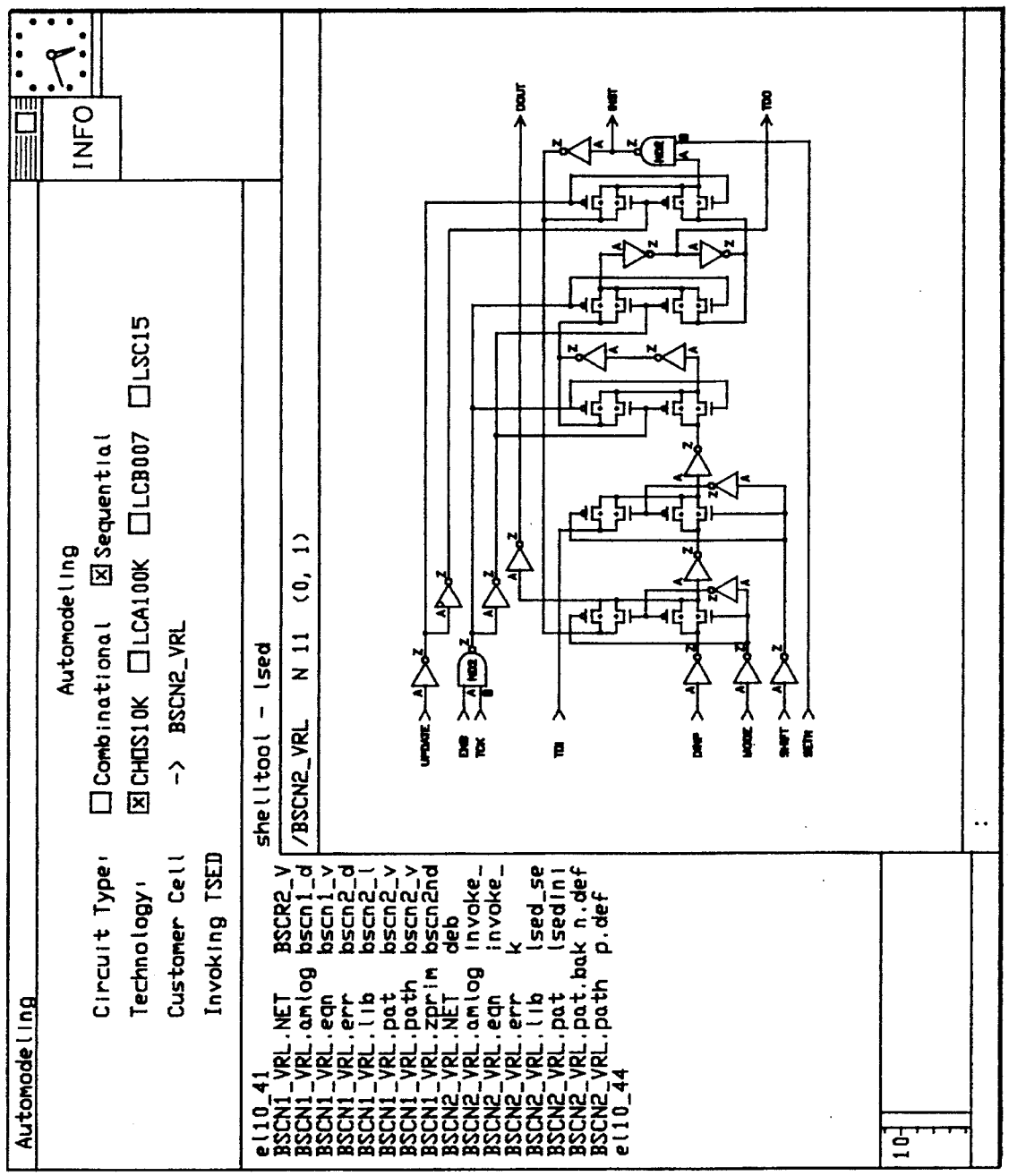
FIG. 12 is a display screen representation of the user's view of the system during model generation for the overall circuit with the sequential portions included.

FIG. 12 is a display screen representation of the user's view of the system during model generation for the overall circuit with the sequential portions included.

Parent U.S. Pat. No. 5,278,769 describes a particular technique for implementing the top-level process of the present invention which invokes all of the sub-processes and controls the overall flow of automatic model generation, and describes the user interaction with the auto-model generation system of the present invention.

The discussion hereinabove with respect to FIG. 1–12 has been primarily directed to generating logic and timing models from a schematic representation of an electronic design. It is possible, and practical, to create an electronic design from a high-level behavioral description without ever entering a schematic diagram. If a schematic diagram of the electronic design is produced, it is produced automatically. (A behavioral description is one which describes an electronic system in terms of its response to external stimulus under specified conditions, i.e., its behavior.)

The following discussion with respect to FIGS. 13–27 is directed to such automated design of electronic systems from behavioral descriptions thereof.

Automated Design: Introductory Comments

In modern digital systems, designs incorporating 70,000 logic gates or more are not uncommon. Also, in modern analog electronic systems, especially where the function being designed is intended to be incorporated into an integrated circuit, it is not uncommon to encounter designs comprising many hundreds of transistors and other electronic devices. These designs, due to their complexity, present a need for frequent simulation of the circuit being designed in small parts before it is simulated as a whole. This is necessary because errors in a small portion of the circuit are easy to detect when that small portion is simulated in isolation. On the other hand, when the entire circuit is simulated, compound errors may occur which mask other errors. Further the enormity of modern circuit complexity makes the errors in the small portion of the circuit difficult to recognize.

In the prior art, the process of designing an electronic circuit on a typical ECAD (Electronic CAD) system is done in several discrete steps. A schematic diagram of the circuit is entered interactively through the use of a schematic editor which produces a digital representation of the circuit elements and their interconnections. The user of the ECAD system then prepares a list of input stimuli (vectors) representing real input values to be applied to the simulation model of the circuit. This representation is then compiled by a schematic compiler and translated into a form which is best suited to simulation. This new, translated representation of the circuit is then operated upon by a simulator, which produces numerical outputs analogous to the response of a real circuit with the same inputs applied. This output is then usually presented to the user in a graphical fashion. By viewing the simulation results, the user may then determine if the represented circuit will perform correctly when it is constructed. If not, he may then re-edit the schematic of the circuit using the schematic editor, re-compile and re-simulate. This process is performed iteratively until the user is satisfied that the design of the circuit is correct.

The schematic editor of the ECAD system is usually an interactive software tool which enables the user to select from a number of circuit elements which will be graphically displayed upon a graphical/text display device, hereinafter referred to as the display screen, connected to the computer. These displayed elements may then be interconnected by lines representing wires drawn on the display screen by the user through interaction with the computer via a position input device, which may be a pointing device such as a mouse, trackball, joystick, graphic tablet, or keyboard used to enter coordinates on the display screen and commands to the software tool. The circuit elements and their interconnecting wires form a schematic diagram which is viewed either in whole or in part on the display screen. As the schematic diagram is constructed on the display screen, the computer represents these elements in a storage medium, which may be a memory or a mass storage device such a magnetic disk drive. These representations, taken as a group, form a numerical representation of the schematic which has been entered by the user in a standardized form which is understood by the schematic editor. Typically, this form has been optimized for the entry and modification of schematic information.

Often, schematic editors allow for heirarchical design whereby a previously created and stored schematic may be recalled and viewed and used as a macro-level component in other circuits. Multiple instances of such macro-level components may be included in a higher-level schematic diagram. The schematic editor creates data structures effectively replicating the macro-level component. The higher-level schematic may further be incorporated as a macro-level component into yet higher-level schematic diagrams, and so on.

FIG. 24

Figure 24:
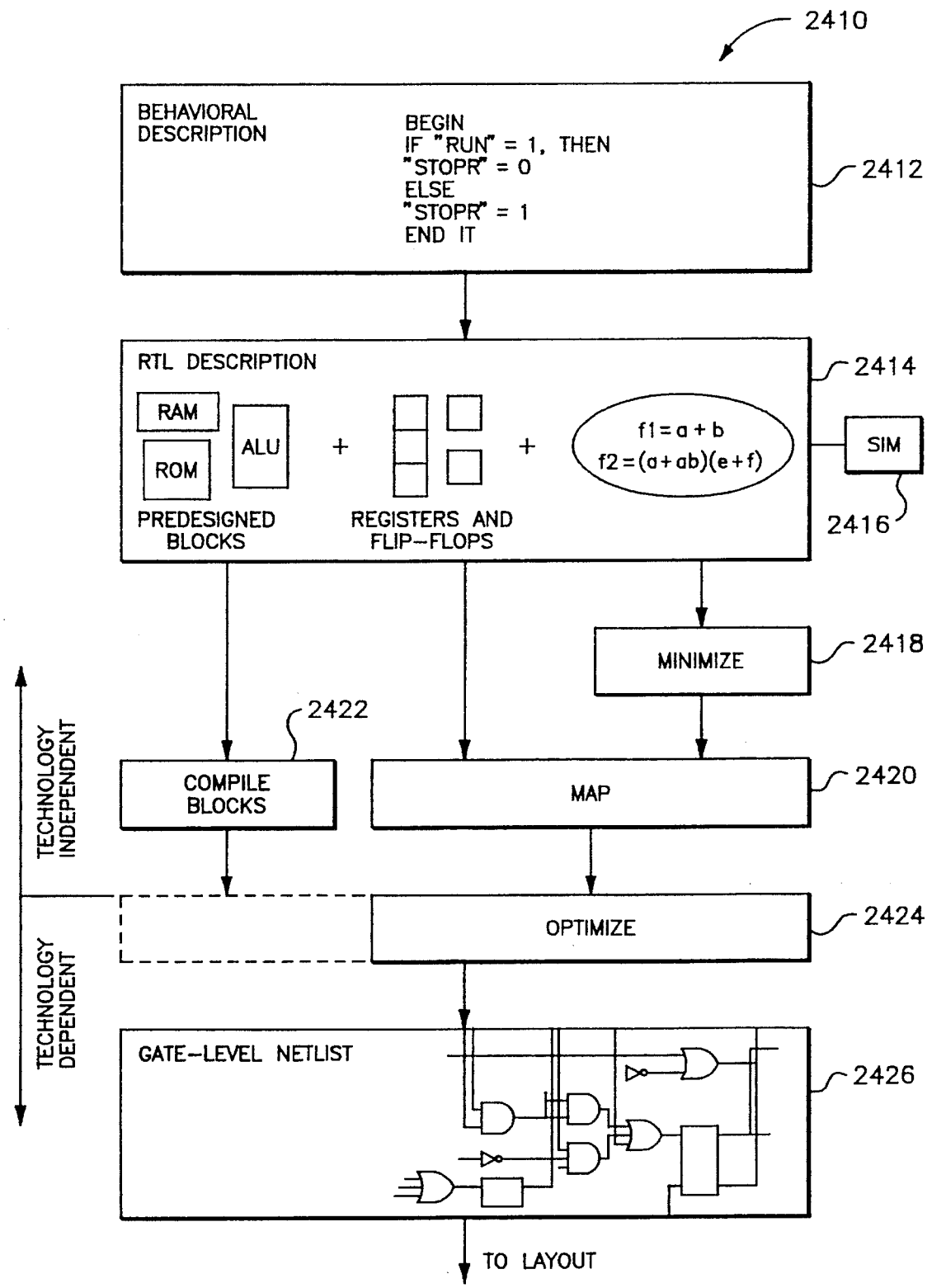
FIG. 24 is a block diagram of a generalized logic synthesis methodology, lacking critical features of the present invention.

FIG. 24 shows a generalized design methodology 2410. It should be understood that the descriptions contained herein are in terms of a suite of software "blocks" that can be run on any suitable computer system (not shown).

A designer begins designing a circuit (or system) by formulating a behavioral description of a circuit's desired behavior in a high-level computer language, such as VHDL. This is represented in the block 2412, which shows exemplary high-level code describing a desired behavior.

Next, the designer re-formulates the design as a register-transfer level (RTL) description of the circuit in terms of pre-designed functional blocks, such as memories and registers. This is represented in the block 2414.

The resulting RTL description is simulated, in a block 2416, to ensure that it equates to the original behavioral description. At that point, the design consists of synthesizable parts (combinational logic, registers and flip-flops) and non-synthesizable parts (pre-designed blocks).

The logic is then minimized in a block 2418, by finding common terms that can be used repeatedly, and maps the description into a specific technology (e.g., CMOS) in a block 2420. Further, the non-synthesizable parts are compiled in a block 2422.

The foregoing steps 2412 through 2422 are all technology independent (except for the step 2422, to the extent that it is technology dependent).

The design of at least the synthesizable parts is optimized in a block 2424 to produce a gate-level net list 2426.

The blocks 2418 through 2422 represent a typical logic synthesis tool.

Strictly speaking, only the steps after the RTL description is produced constitute "logic synthesis", and such a bottom-up approach (re-formulating the behavioral description into a RTL description) tends to be flattened out and/or lose much of the intent of the original behavioral description, as well as being labor-intensive and error-prone.

According to the present invention, described below, "behavioral synthesis" will bridge the gap between a behavioral description and a RTL description to produce a valid gate-level net list automatically from a high-level behavioral description. In a sense, behavioral (e.g., VHDL) and RTL circuit descriptions can both be considered "high-level" descriptions, since they do not deal with gate-level representations. The distinction between a behavioral description and a RTL description is primarily in the amount of structure that they specify and in the "allocation" or definition of structural components that will be used in the resulting gate-level implementations. Behavioral descriptions do not address the issue of what specific structural components (e.g. memory, functional blocks, etc.) are to be used. In an RTL description, structural components are explicitly identified and there is a direct mapping between this description and the resulting gate-level implementation.

The ability to synthesize behavioral and RTL descriptions is significantly impacted by this difference in structural content. RTL synthesis ("low-level" synthesis) is a relatively well-studied, and much implemented, technology. The ability to synthesize an RTL description into a gate-level implementation is well established. The present invention discloses a methodology for mapping a behavioral description with little or no structural content into a RTL level description with significant structural content. This is largely, but not entirely, a top-down design methodology.

What is lacking in a strictly top-down design methodology is the use of detailed knowledge of lower level physical information of the modules (circuits, functional blocks, etc.) being designed. Typically, the decisions concerning the selection and placement of modules are deferred until the time the behavioral synthesis is complete and an RTL structure has been chosen for the implementation. The reason for this is that, typically, structural information is not available at the behavioral level, and hence the system is unable to employ criteria such as area and delays while exploring the design space. Details such as layout, module size and interconnect can have an enormous effect on the shape of the RTL design space.

As will become evident hereinafter, partitioning the design at a high level (behavioral description) into architectural blocks creates a "vehicle" for providing such structural information at the behavioral description level, thereby adding the ability to estimate lower-level physical parameters. Further, partitioning helps the designer explore other avenues such as operator level parallelism and process level concurrency in order to improve the design.

FIGS. 13–20

There follows an exemplary embodiment of the invention described in the context of an ASIC design.

FIG. 13

Figure 13:
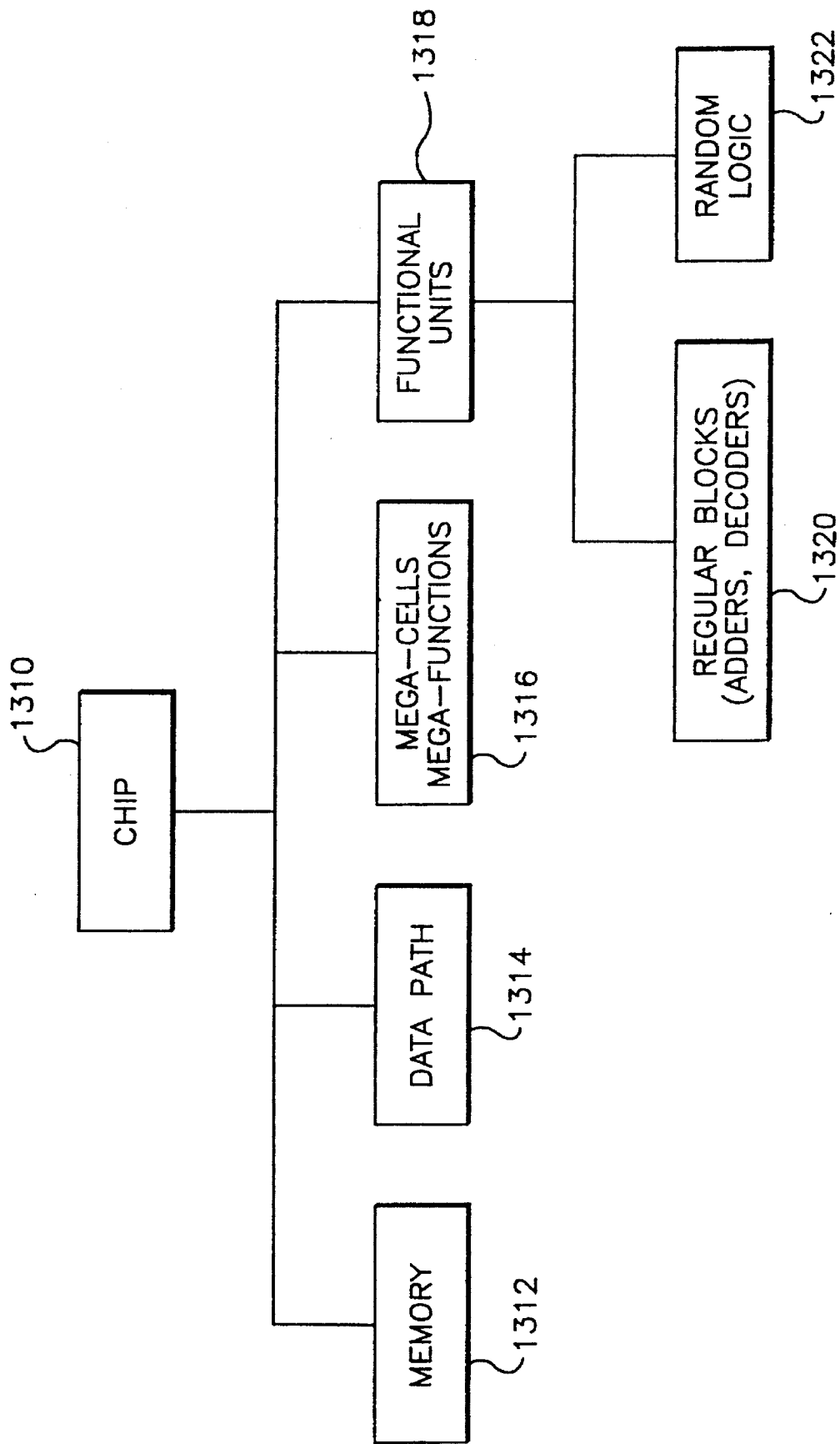
FIGS. 13–19 are schematic representations of the methodology of the present invention.

FIG. 13 is a simplistic view of an ASIC chip 1310, covering gate arrays and standard cells, in the context of synthesis. In general, an ASIC chip consists or all or some of the different functional entities shown in the Figure. Moreover, the Figure describes means for synthesis/compilation and optimization of these blocks. Not shown in the Figure are the chip's I/O buffers and periphery. Although synthesis tools are not meant to manipulate I/O buffers, nevertheless their timing description in the optimization environment can be beneficial for optimization of the chip's core part.

The exemplary chip 1310 includes the following major functional blocks: memory 1312, data path 1314, mega-cells and mega-functions 1316 and functional units 1318 which may include regular blocks 1320 such as adders and decoders and random logic 1322.

The memory block 1312 is generated by memory compilers using efficient technology-dependent building blocks. The output of the memory compiler is a net list of primitive transistors.

The data path block 1314 is generated by providing the behavioral description in an HDL (Hardware Definition Language) language. The data paths can be synthesized through general purpose synthesis programs or specialized data path compilers. The output of the synthesis programs/compilers is the structural description of the design using ASIC macro-cells.

The mega-cell and mega-function block 1316 is chosen from pre-designed building block libraries, which are already designed for optimal performance.

The regular functional units 1320 are generated using regular blocks such as adders, decoders and multiplexers. These blocks can be further optimized, if desired.

The random logic blocks 1322 includes random logic, glue logic and the state controller. The description of these units is provided in Boolean equations, truth table, data flow and HDL description. This part of the chip is designed around the other parts. This functional unit is partitioned into smaller chunks of functional units, and the process is recursively repeated. The atomic features are still functional units that are readily functionally verifiable. A general purpose synthesis/optimization tool is used to create these functional units, and to optimize the units according to the specified constraints and those imposed by memory, regular blocks and data path sections.

FIGS. 14-17

FIGS. 14-17 describe a synthesis design methodology that is independent of any particular design style or technology. The various steps (blocks) of this methodology are represented by the circled numerals 1-18, and are as follows:

Step 1 is Design Specification. This consists of system (device) specification and may include functional specifications of subsystem elements, timing specifications and I/O requirements, and power, package and interface requirements.

Step 2 is Design Description. This is the functional description of the design and all its subsystem elements. The description is, ideally, given in a high level description language, such as VHDL. Depending on the nature of the design, the description can be entirely at the behavioral level, or it may be intertwined with an RTL description.

Figure 25:
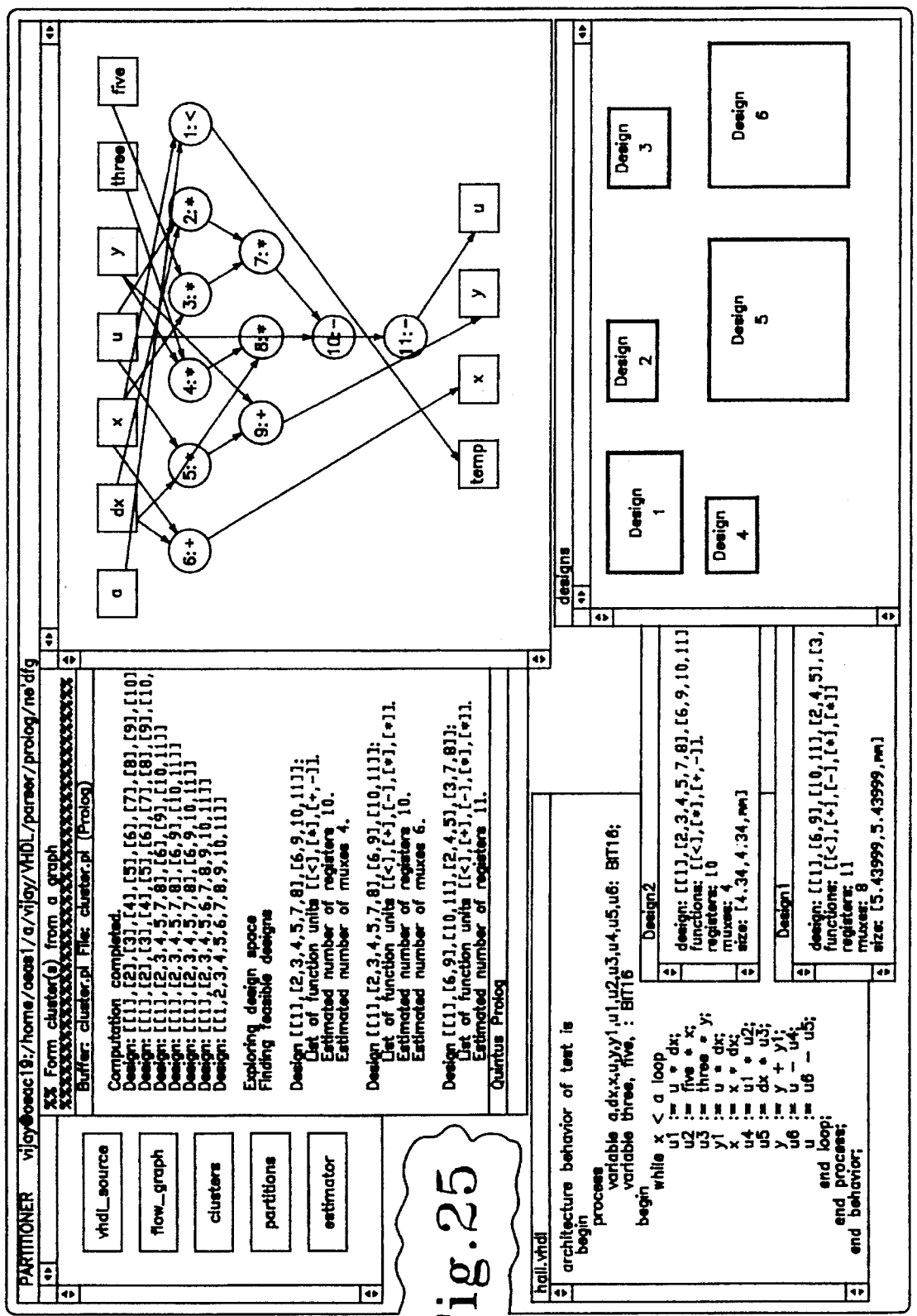
FIGS. 25–27 are exemplary screen displays generated by a computer system employing the methodology of the present invention.
Figure 26:
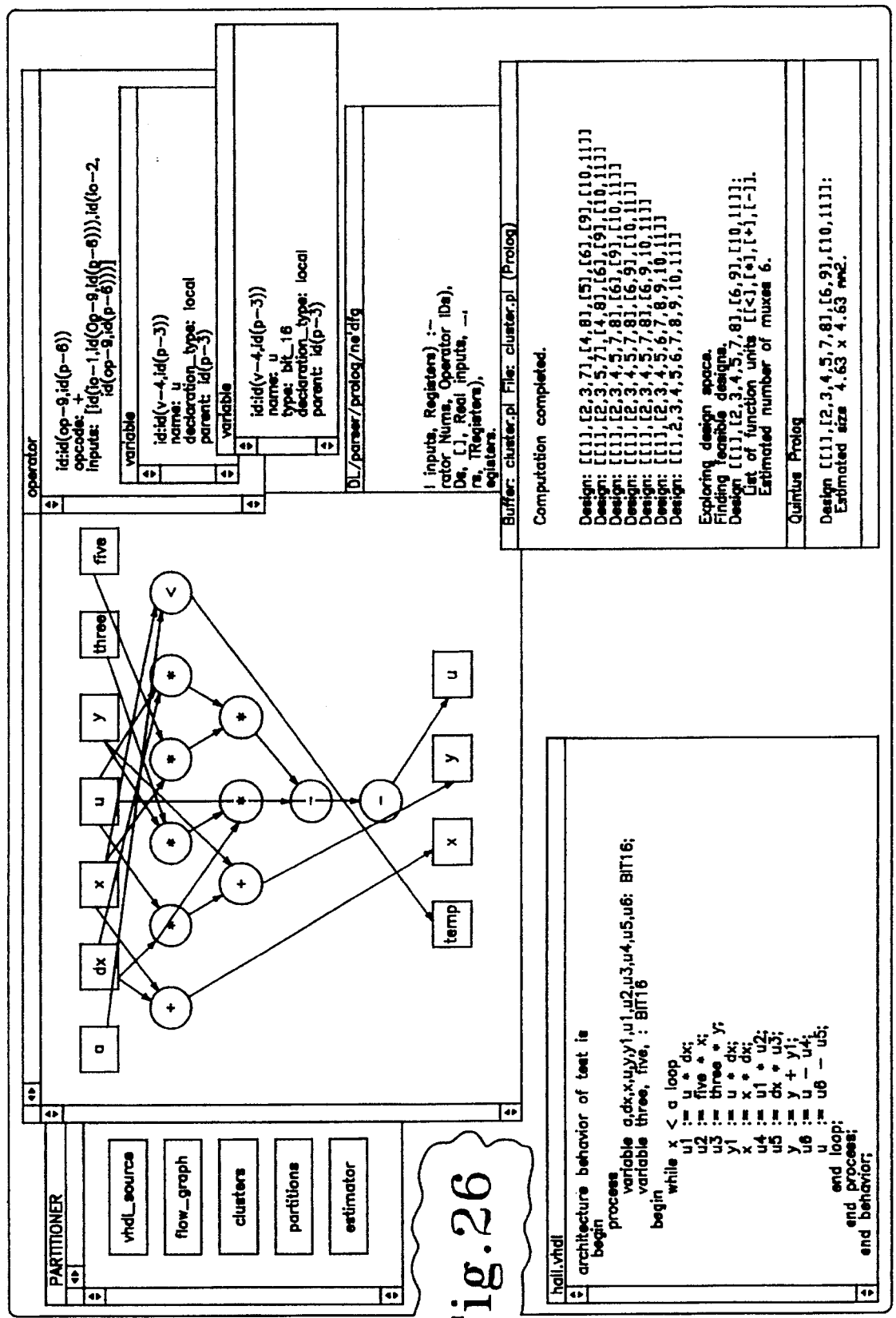
Figure 27:
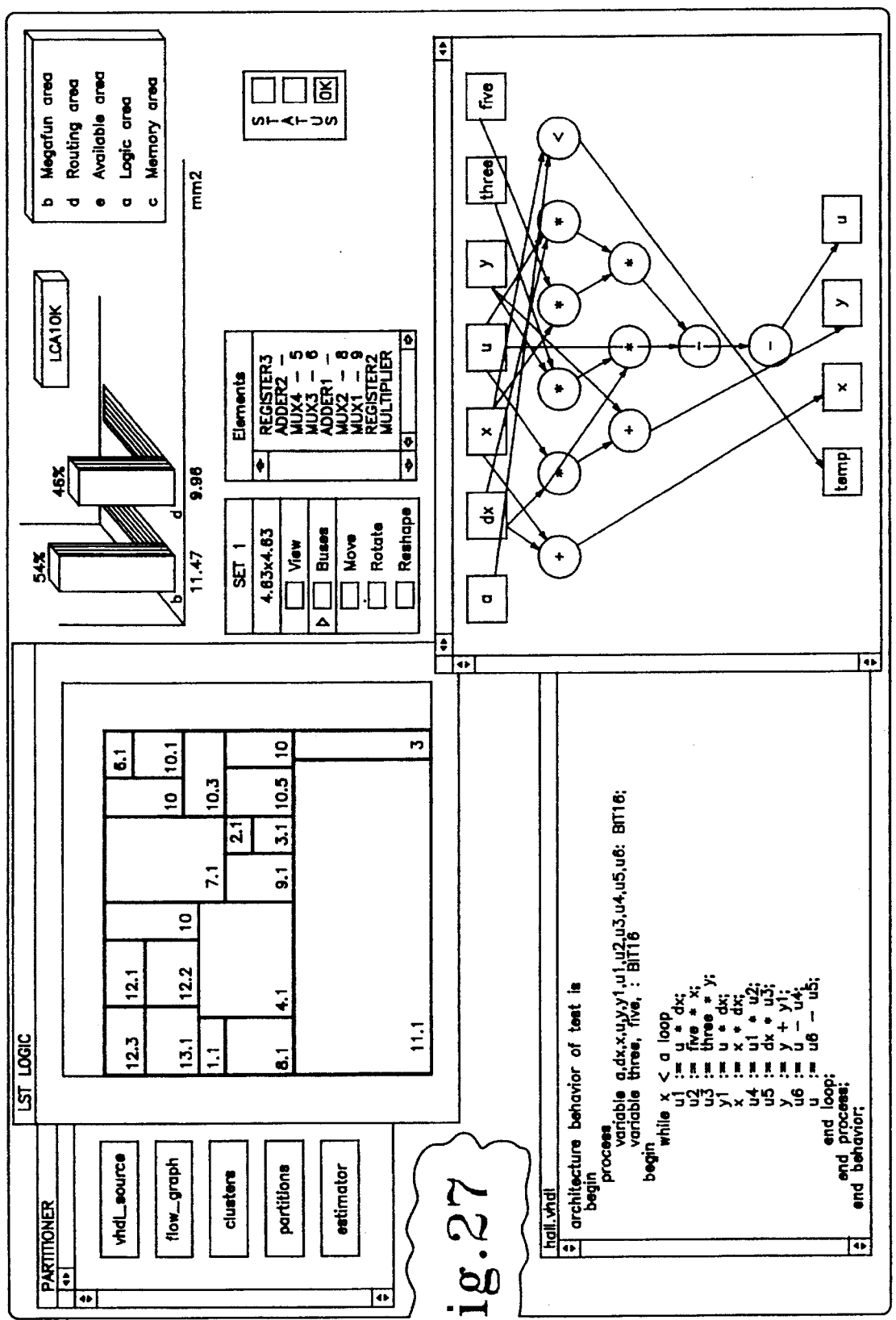

Step 3 is Partitioning. Given the behavioral description of the design, partitioning (the Partitioner) breaks the design into separate modules that will make the overall synthesis, analysis and verification tasks more manageable. In doing so, the Partitioner consults technology files (described hereinafter) containing packaging, I/O capabilities and other technology-dependent information to optimally partition the design. In addition to functionally partitioning the design, the Partitioner can help the designer (see FIGS. 25-27 showing representative screen displays of the CAE system) in choosing the optimal architecture that would optimize the design, e.g. in terms of area and speed.

Step 4 is Module Description. Three modules are shown, but there could be many more modules involved. This is the RTL description of the partitioned design, in terms of an HDL (hardware definition language) description. Each module is accompanied with a set of timing and area constraints, which are related only to that module's domain (they are not automatically derived from the design description).

Step 5 is Composition. Composition is the opposite of partitioning, and facilitates examination and verification of the partitioned design. The partitioned design is reconstructed in this step, the end product of which is an RTL description of the entire design.

Step 6 is Functional Verification (Behavioral). Verification at the behavioral level is performed at two stages—while the design is being developed, and after the partitioning step. The former is source code debugging where the high level description of the design is verified for correctness of the intended functionality. The latter is to verify the architectural decisions that were made during partitioning, and to examine their impact on the functionality and performance of the entire design.

Figure 14:
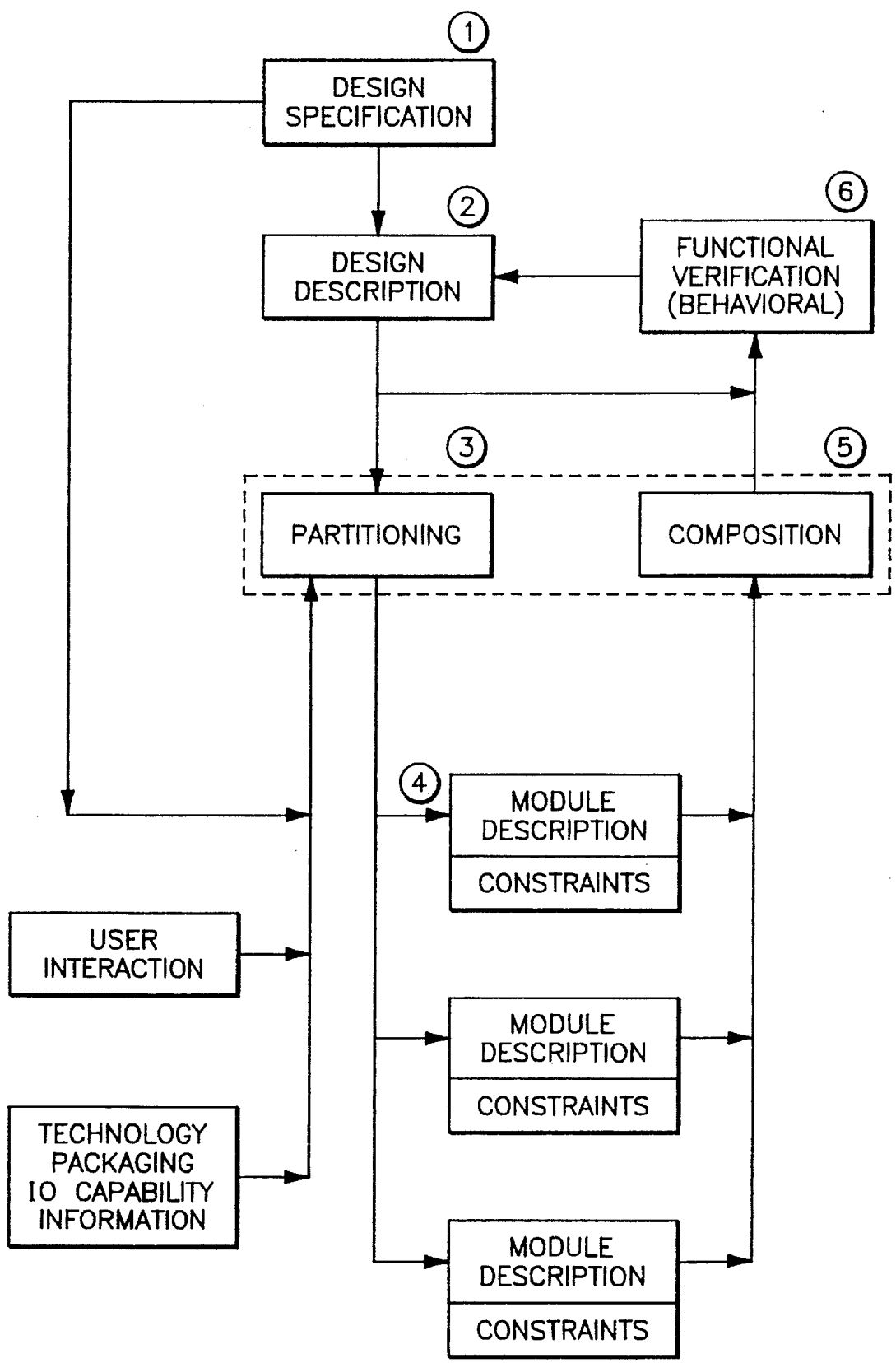
Figure 16:
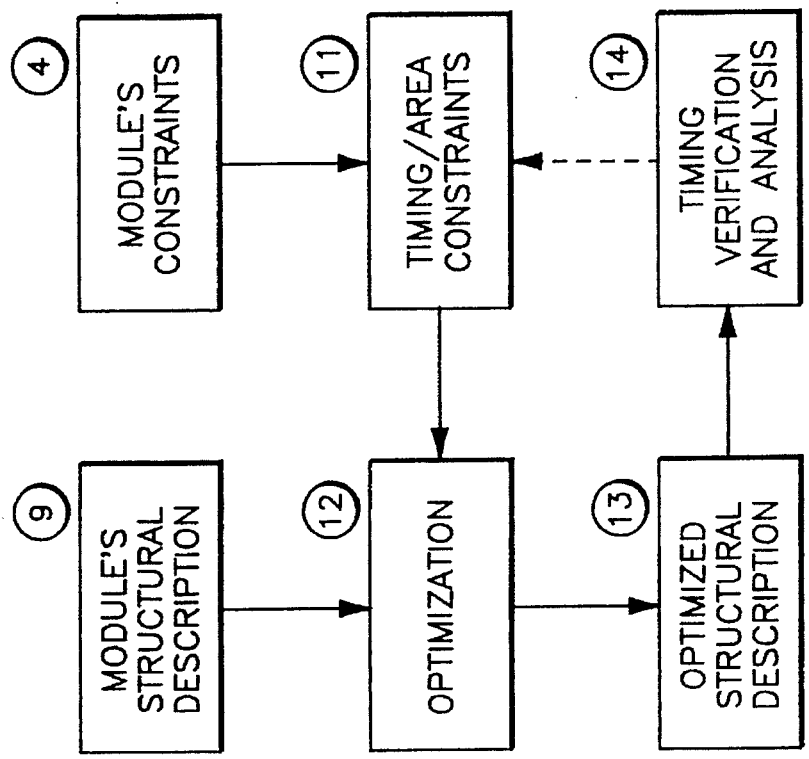
Figure 15:
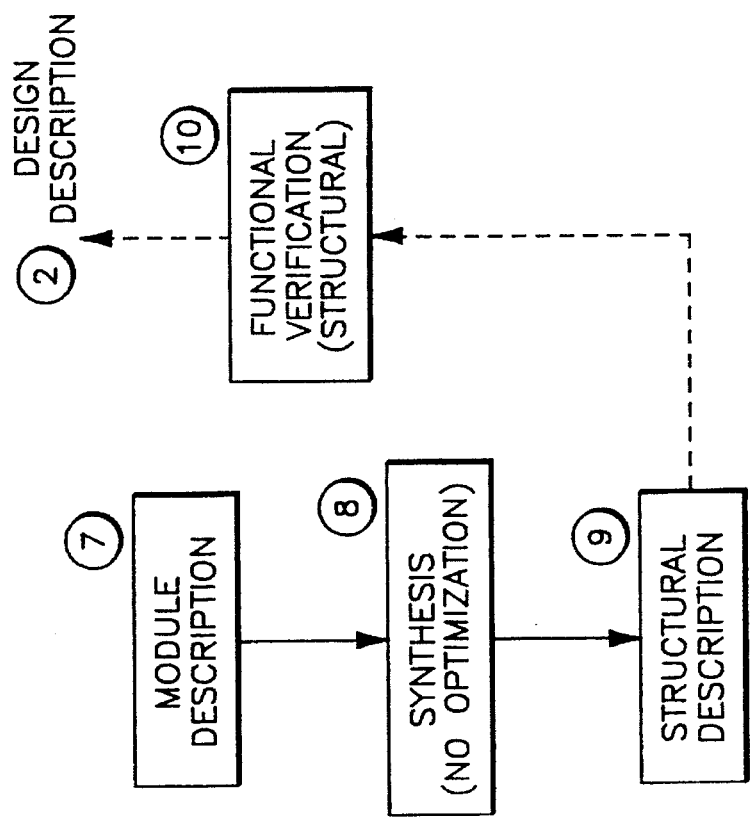
Figure 17:
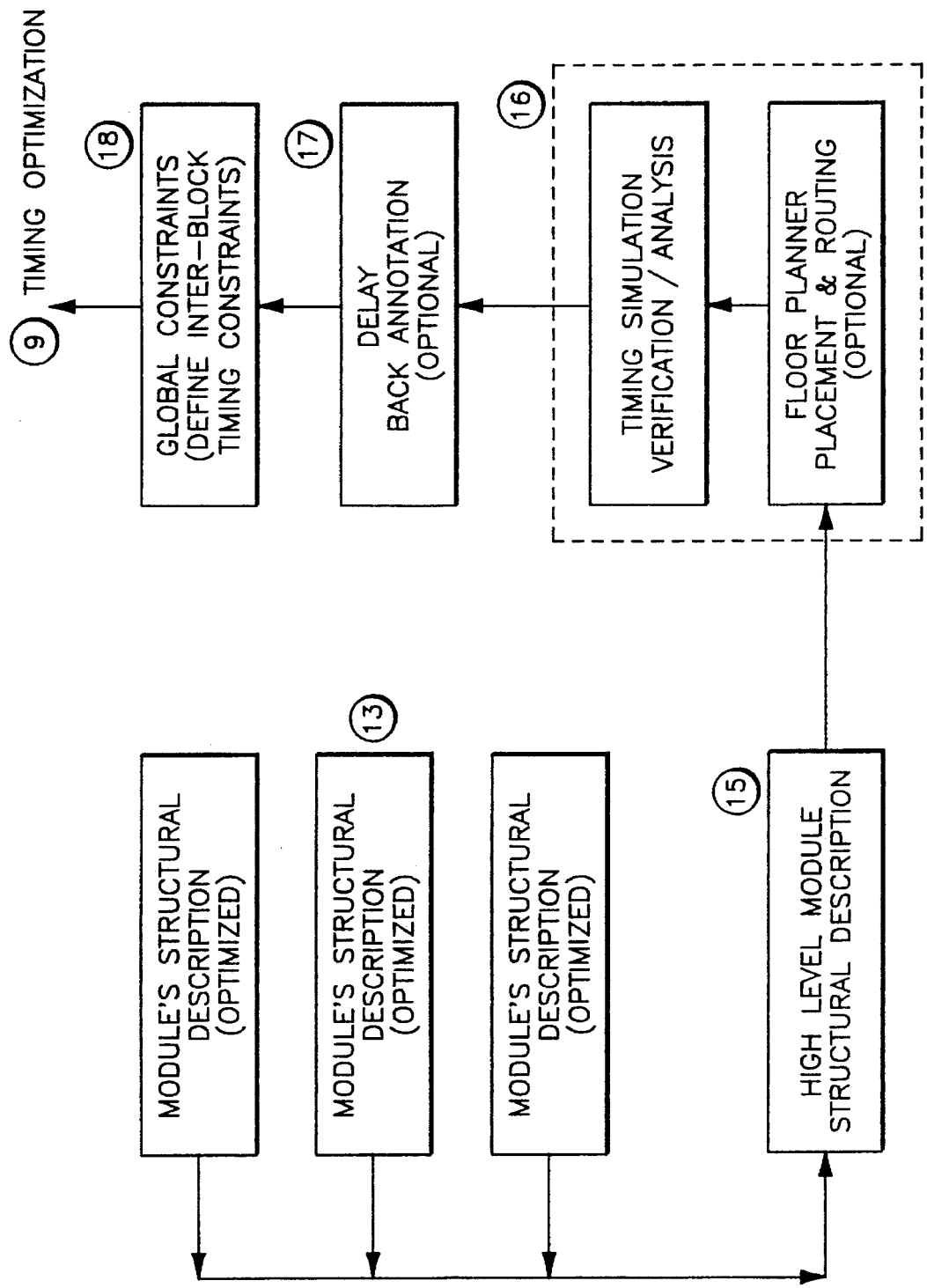

It will be noticed, in the above description of the steps shown in FIG. 14, that various "loops" are formed. A high level loop consists of behavioral verification (step 6) to debug the design description (step 2). A lower level loop consists of behavioral verification (step 6) of the partitioned (step 3) and composed (step 5) design. The partitioning process is guided by user interaction, and is driven by physical implementation factors such as technology, packaging, I/O capability and other information about the proposed device which is developed based on experience with similar devices.

Step 7 is Module Description. This is the description of a functional entity that is produced by the Partitioner or developed independently by the designer. This is preferably given in one of the following formats: HDL, truth table, equations or net list. As used in this example, a "module" is a functional block with a complexity of less than 3000 cells (it is not a chip with I/O pads).

Step 8 is Synthesis. Given the module description (step 7) and a target technology library, the design is mapped into the target technology. The synthesis process usually includes some form of logic optimization. This is the task of manipulating the logic expressions that define the functionality of the module (device). Minimization is done by removing redundancies, and adding or removing intermediate levels of logic (e.g., re-structuring of Boolean expressions).

Step 9 is Structural Description. This is the gate-level, technology-dependent description of the module produced by the synthesis tool. It is usually given in the form of a net list, from which a device can be automatically physically created.

Step 10 is Functional Verification (Structural). This is done to verify the correctness of the module against the intended functionality. This is only required if functional verification at the behavioral level (step 6) has not been performed. One assumes that the circuit generated by the synthesis tool complies (functionally) with the given module description. In case of discrepancies, the module description needs to be modified (debugged) at the top level, i.e. Design Description (step 2). This is necessary in order to preserve the integrity of the design and all of its subsystem elements.

Step 11 deals with Timing/Area Constraints. These are used to customize the optimization process. Optimization is usually driven by area and speed (timing) constraints. These might instruct the tool to perform rudimentary area versus speed trade off on individual or small clusters of gates, or to perform comprehensive area and speed optimizations in combination with other constraints such as drive capability. A rich set of constraint constructs is required for meaningful design optimization, and are provided in the methodology of this invention. Timing constraints may include the following: maximum and minimum rise/fall delay, set-up and hold check, length of clock cycle and maximum transition time per net. The timing constraints may also include boundary conditions, such as signal skew at the module's inputs, drive capabilities of the modules outputs, etc., when such data is available.

Step 12 is Optimization. Given the design constraints and the module's structural description, the optimization process tries to modify the module so that its area and timing characteristics comply with the specified constraints. Depending on the nature of the design and the strength of the constraints, some or all optimization goals will be achieved. When no boundary conditions are available, optimization may be general purpose, aimed at minimization of the overall module. With boundary conditions, the objective is to optimize each module so that the overall higher level module complies with the specified timing requirements.

Step (block) 13 represents generating the Structural Description of the module after the optimization process.

Step 14 is Timing Verification and Analysis. This is a process of examining the effects of the optimization process (step 12), and examining its global impact. Tools such as static timing analyzers and gate level simulators would be employed. If the optimized module (step 13) does not meet all of the timing and area requirements, further trade-offs have to be made at this point. The constraints are then modified to reflect these trade-offs, and the optimization process (step 12) is repeated.

Step 15 represents a high level module, derived from the module's optimized Structural Description (step 13). A high level module consists of one or more sub-modules. Each sub-module has been optimized in its own domain. The high level module describes the interaction and connectivity between the sub-modules. When hierarchically applied, the target device itself is considered to be a high level module.

Step 16 is Timing Simulation, Verification and Analysis. At this stage, the optimized modules are composed (see step 5) together and implement the intended functionality of the high level module, or target device. Here, analysis includes logic level simulation, static timing analysis, electrical rule checking, etc. For more accurate analysis, it might be necessary to use a floor-planner or placement and routing programs to estimate wire delays. The wire delays are then back annotated into the design database prior to simulation. If the overall timing characteristics of the modules do not meet the specified requirement,a the timing constraints of the sub-modules are modified and optimization is performed.

Step 17 is Delay Back Annotation (DBA), which is optional. The inter-block wire delays can be more accurately estimated only after floor-planning of the sub-modules. More accurate intra-block and inter-block delays are determined after the placement and routing stage. Using these tools, the wire delays can be estimated more accurately. The delays can be back annotated to be used by the gate level Optimizer (step 12).

Step 18 represents introducing Global Constraints. Using the results of the analysis performed, the sub-modules' timing/area constraints are modified to reflect the global timing requirements. Sub-modules with new constraints are then re-optimized.

FIG. 18

Figures 18, 19:
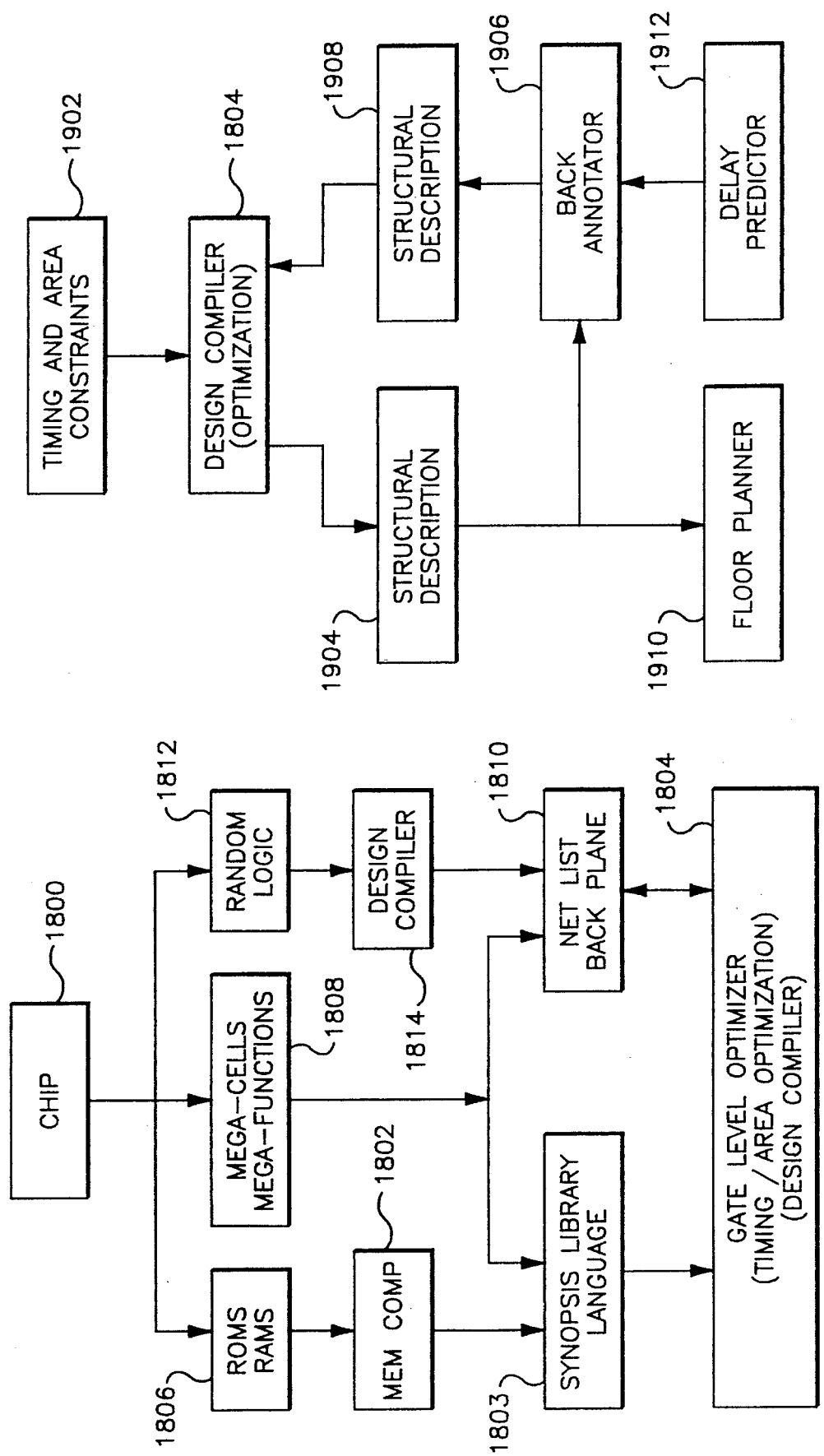

FIG. 18 illustrates the usage of exemplary synthesis and optimization tools, and the abstraction level for the exchange of design data between these tools and a Design Compiler. Each tool addresses the synthesis or compilation of one or more of the major functional blocks of an exemplary ASIC chip 1800. The usage of these tools and their interaction with the Design Compiler are of particular interest.

A Memory Compiler (MemComp) 1802 takes the high level specification for memory mega-cells and produces logic and layout files for the purpose of simulation, testing and layout. The objective is to provide the Design Compiler (Optimizer) 1804 with an accurate timing description of and drive capability information for the memory block. MemComp synthesizes high density or low power RAM or ROM blocks 1806. As will become evident, the surrounding logic is optimized with respect to the memory block. The memory block created by MemComp 1802 is provided in the same format as the internal macro-cells, i.e. a net list of primitive transistors, which cannot be read directly by the Design Compiler 1804. Therefore, one of two possible intermediate steps is required: 1) (not shown) the data sheet generated by MemComp is used to manually extract the timing description of the memory block This basically involves defining a set of "set_load" "set_drive" and "set_arrival" constraints and associating them with the relevant pins of the surrounding logic at the start of the optimization process; or 2) a Memory Modeller (see FIG. 20) is used to generate a model 1803 in Synopsys Library Language (SLL; available from LSI Logic Corporation). The Memory Modeller reads the memory description and generates a complete timing description of the memory block. This contains all of the setup and hold values and the timing arcs and I/O pin characteristics. This task is similar to that of the Synthesis Library Model (SLM; available from LSI Logic Corporation) generator.

Mega-cells and mega-functions 1808 are treated as basic building blocks, similar to the macro-cells in the synthesis library. Both are generally developed beforehand for optimal performance, so no optimization is required on these blocks. They are presented to the Design Compiler 1804 simply to provide timing information so that the surrounding blocks can be optimized. The mega-cells are modeled in the same manner as the macro-cells, i.e. by using the Synopsis (SLL) library format. The mega-functions are ported into the Design Compiler in Synopsys DataBase (SDB) format. (The netlist back plane 1810 is used as the primary design representation medium). Generally, the mega-functions model industry-standard functions, thereby providing the designer with a set of popular and proven standard building blocks. In the case of certain, highly-specialized, user-defined mega-functions, it would be necessary to ensure appropriate capability in the Design Compiler.

Random logic 1812, in other words the remaining modules that were not synthesized using the previously described tools and libraries, are synthesized by a general purpose logic synthesis tool 1814 that optimizes the design for speed and area. It accepts hierarchical combinational and sequential design descriptions in equation, truth table, net list and/or VHDL formats. The optimization process is directed by specifying the "goals". Goals are represented as timing constraints. The optimization process makes trade-off evaluations and produces the best possible gate level implementation of the design for the specified constraints.

Since the Design Compiler 1804 provides an environment for synthesis and constraint-driven optimization, it can be used as the overall synthesizer/optimizer. Blocks created by other tools can be loaded into the Design Compiler, where the timing information from these blocks can be used to synthesize and optimize the surrounding logic. For example, knowing the drive capabilities and the skews of the memory blocks' outputs would allow for accurate optimization of the glue logic.

Figure 20:
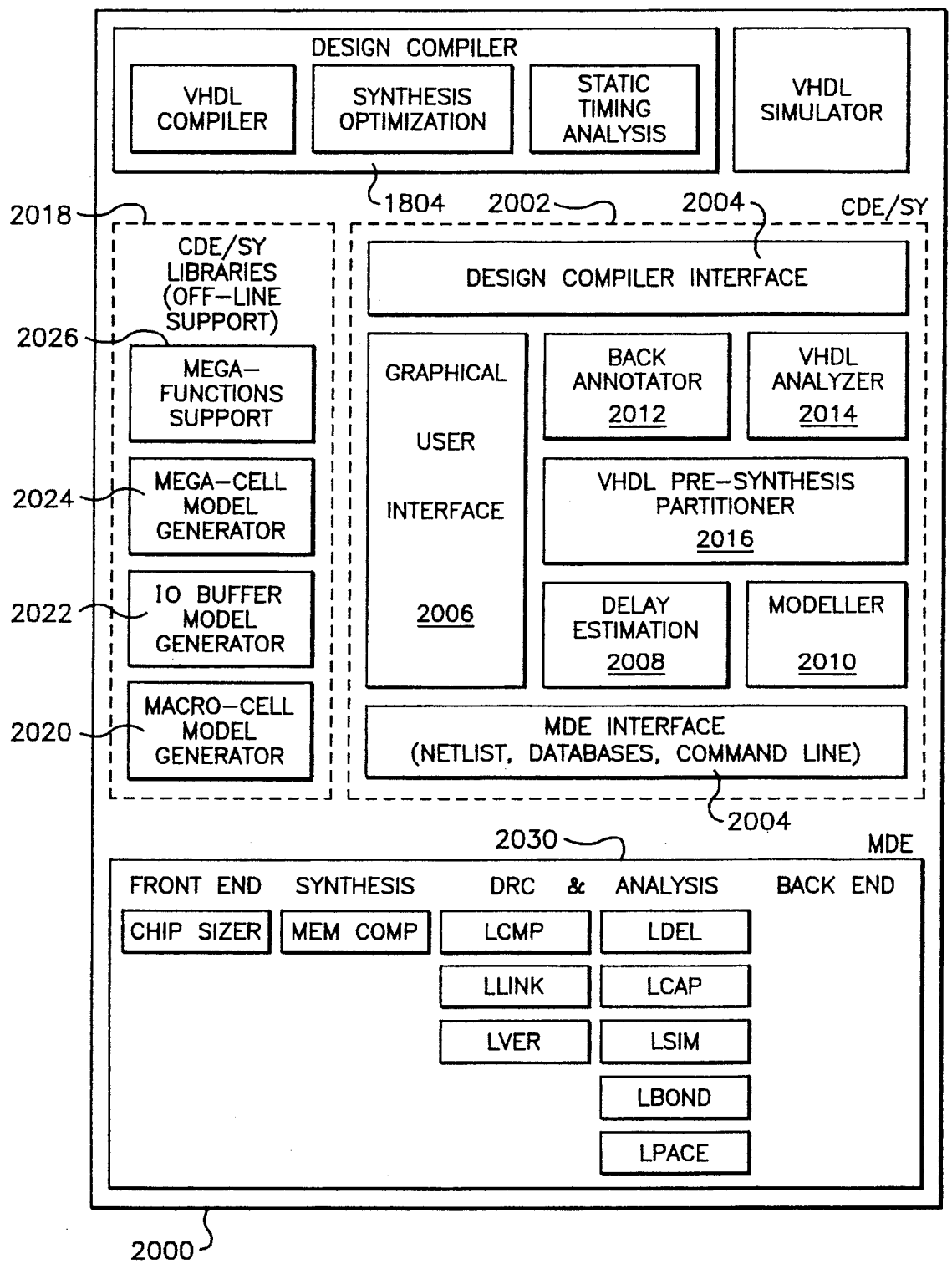
FIG. 20 is a block diagram of a suite of exemplary software tools for implementing the methodology disclosed in FIGS. 13–19.

Once the memory blocks are synthesized, and the appropriate mega-cells and mega-functions are chosen, the remainder of the design can be synthesized by the Design Compiler. Optimization is then performed according to user-defined timing constraints (see User Interface; FIG. 20) and those dictated by existing blocks. This is an iterative process. Constraints need to be refined until the desired timing and area requirements are achieved.

FIG. 19

FIG. 19 shows a synthesis design framework. The objectives of the disclosed framework are: to provide a unified front end for a set of synthesis and optimization tools; to provide an integrated synthesis environment by incorporating specialized synthesis tools with the Design Compiler, which is the main synthesis and optimization tool; to provide the capability of constraints-driven gate-level optimization of both sequential and combinational designs; to provide back annotation of wire delays from the Modular Design Environment (MDE; available from LSI Logic Corporation, described hereinafter) to the Design Compiler to make the necessary timing/area trade-off evaluations based on more accurate wiring delays; to provide a window-based graphical interface between the synthesis tools and the MDE module to control the data flow between the Design Compiler, the other synthesis tools and the MDE; to provide VHDL debugging, and analysis capability to front-end synthesis from VHDL; and to provide VHDL pre-synthesis partitioning capability to front-end synthesis form VHDL.

Generally, the design framework illustrated in FIG. 19 follows from the design methodology described hereinbefore. The methodology includes the following important steps:

- partitioning the design into memory blocks, mega-functions, mega-cells and random logic;
- using a layout tool, such as LSI's ChipSizer (see FIG. 20), to obtain the required die size, which is a function of the area, the number of pins and pads and other factors;
- choosing the mega-cells and mega-functions to be used, and characterizing the cells for the Design Compiler;
- generating memory blocks, and characterizing them for the Design Compiler;
- partitioning the random logic into smaller functional units;
- using the Design Compiler to synthesize the remaining blocks, in a "bottom-up" manner, starting with the lower level functional units, including: verifying the functionality of the block using functional verification tools or simulators; optimizing the design for area or, in general terms, for timing of some or all of the selected paths; composing the higher level functional blocks and, when a functional block interfaces with an existing building block (e.g. memory, mega-cells, mega-functions), optimizing the functional unit (and all or some of its lower level units) according to the timing/area constraints 1902 imposed by the building block; and repeating these steps until all of the functional units are synthesized into a structural description 1904. The resulting structural description 1904 may be back annotated 1906 as a structural description 1908 (of timing/area constraints) to the Design Compiler. In the loop shown:
- for larger functional blocks, a floor planner 1910 is used for placements and more accurate wire delay prediction 1912 and, with this information, using the more accurate block size provided by the floor planner to re-estimate the internal wire delays of the lower level functional units and back-annotating these delays into the Design Compiler to provide more meaningful internal timing optimization, and/or using the wire delays of the inter-block buses and wires to derive the appropriate boundary constraints for timing optimization, i.e. to specify inter-block delays through constraint constructs; and
- incorporating the timing delays and drive capabilities of I/O buffers into the timing constraints. (The I/O buffers should be selected as early in the design cycle as possible.)

FIG. 20

FIG. 20 provides an overview of the design framework, illustrating an exemplary suite of tools, many of which are commercially available (as individual units), for implementing the methodology of the present invention. Herein it is important to note that the methodology of the present invention augments many discrete software tools, such as those described herein, and provides enormously increased functionality in the context of behavioral synthesis, which otherwise would not be available by simply combining these tools.

The design framework, hereinafter termed the Co-Design Environment (CDE) 2000 is divided into two sections: on-line design tools and off-line design tools. The on-line design tools are programs that are utilized directly or indirectly by the user during the design process, and are relatively generalized to handle a variety of design objectives. The off-line design tools are programs that generate libraries and models of the various building blocks for the Design Compiler, and may be very user-specific.

A first group 2002 of on-line tools, labeled CDE/SY, constitutes the dynamic part of the Co-Design Environment and includes the following:

A Design Compiler Interface 2004 (shown in two parts) controls the data flow and interactions between the MDE and the Design Compiler 1804. It enables the user to follow the process of the design from one environment to the other, and interacts with the MDE programs via script shells and a command line. Interactions with the Design Compiler are achieved through the dc-shell script and constraints files.

A Graphical User Interface (Graphical UI) 2006 facilitates user interaction with the CDE by: abstracting out those steps of the design flow that do not require the designer's intervention, assisting and guiding the designer through the various stages of the design process as outlined by the synthesis framework, and assisting the designer in the composition of the constraints file for optimization.

A Block Level Delay Estimator 2008 provides the optimization tool with pessimistic wire delays which, in turn, causes the optimizer to compensate by placing buffers in and around the block or to use high power gates all over the design, and is especially applicable to small functional blocks. An advantage of using the Block Level Delay Estimator is that in pre-place and pre-layout stages of the design, both the synthesis and the analysis tools consider the wire delays to be a function of fan-out only. Although this might be a good estimate for the purposes of analysis, it has some undesirable side effects on the optimization process. Usually, in the present methodology, optimization is performed on a functional block of less than a few thousand gates, but most existing wire delay algorithms (based on fan-out) are geared towards much larger, die-sized blocks. Hence the Block Level Delay Estimator provides more realistic estimates of wire delays for the block size being manipulated through the system, and provides appropriate tables (wire_loading) to be used by the Design Compiler.

A Memory Modeller 2010 reads the net list of a memory block created by MemComp (See 1802, FIG. 18), and generates a timing model (in SLL) to be used by the Design Compiler. The objective is to provide the Design Compiler with accurate timing information about the memory block. This will help the optimization process as the drive capabilities, the capacitive loads, and the setup and hold time of the memory I/O will automatically define some of the constraints for the surrounding logic.

A Delay Back Annotator (DBA) 2012 comes into play after the floor planning stage, and provides more accurate wire delays into the optimization database. The DBA is used for two distinct purposes: 1) to back annotate wire delays for a block that is going to be re-optimized, using the latest (and most valid) delay values); and 2) to back annotate wire delays for a block that has been optimized and has met the design constraints, thereby providing the latest delay values for accurate modeling of the block so that surrounding blocks can better be optimized.

A VHDL Analyzer 2014 provides source code (VHDL) debugging and assists in functional verification of the VHDL description. The VHDL Analyzer is discussed in greater detail in FIGS. 22 and 23, and in the annexed code listing.

A VHDL Pre-Synthesis Partitioner 2016 partitions behavioral descriptions (VHDL code) into RTL descriptions of modules and sub-modules. During partitioning, appropriate architectural decisions are based on time/area analysis.

The off-line part of the CDE is a collection of libraries 2018, which are either in SLL (Synopsis Library Language) or SDB (Synopsys Data Base) format. SLL is a dedicated language for modelling of cells or modules, and is most suitable for synthesis and timing (static) analysis. SDB (available from LSI Logic corporation) is the Design Compiler's database, and can contain a design description in a multitude of formats, including Boolean expressions, truth tables and net lists.

A Macro-Cell Model Generator 2020 reads the structural description of the macro-cells from the MDE libraries and generates the appropriate models in SLL. The behavior of sequential cells may be modeled by the Model Generator, subsequently to be manipulated by the Design Compiler.

An I/O Buffer Model'Generator 2022 provides timing and drive capability information on the I/O buffers, which are modeled as ordinary macro-cells in the CDE environment. Data derived therefrom is used for optimization of the logic inside the chip. The Optimizer (Design Compiler 1804) is not expected to manipulate the I/O buffers. This Model Generator is capable of handling configurable buffers, which are modelled as "n" cells, where "n" is the number of all the possible configurations of that buffer.

A Mega-Cell Model Generator 2024 is similar to the Memory Modeler in the on-line portion of the CDE in that the objectives are generally the same. However, as mega-cells are static and do not change from one design to the other, this modelling can be performed in advance to create a synthesis mega-cell library.

Mega-Functions Support 2026 provide the Design Compiler with timing information about the mega-functions. This helps the optimization process, since the drive capabilities, capacitive loads, and path delays of the mega-functions will define some constraints for the surrounding logic. Mega-functions are essentially "black boxes" from the user's point of view. Therefore, the Design Compiler is configured to prevent users from viewing or altering the mega-functions.

The various functions of the Design Compiler are shown in the block 1804, and a VHDL Simulator (for behavioral and structural verification, discussed hereinbefore) is shown at 2028.

Illustrative tools (ChipSizer, MemComp, LCMP, LLINK, LVER, LDEL, LCAP, LSIM, LBOND and LPACE), commercially available within LSI Logic's Modular Design Environment 2030 are shown. Generally, these tools consist of a set of programs that compile, link, simulate and verify digital logic at the chip (structural) level. Any number of other, commercially available programs could be employed at this level to perform similar functions.

FIG. 21

Figure 21:
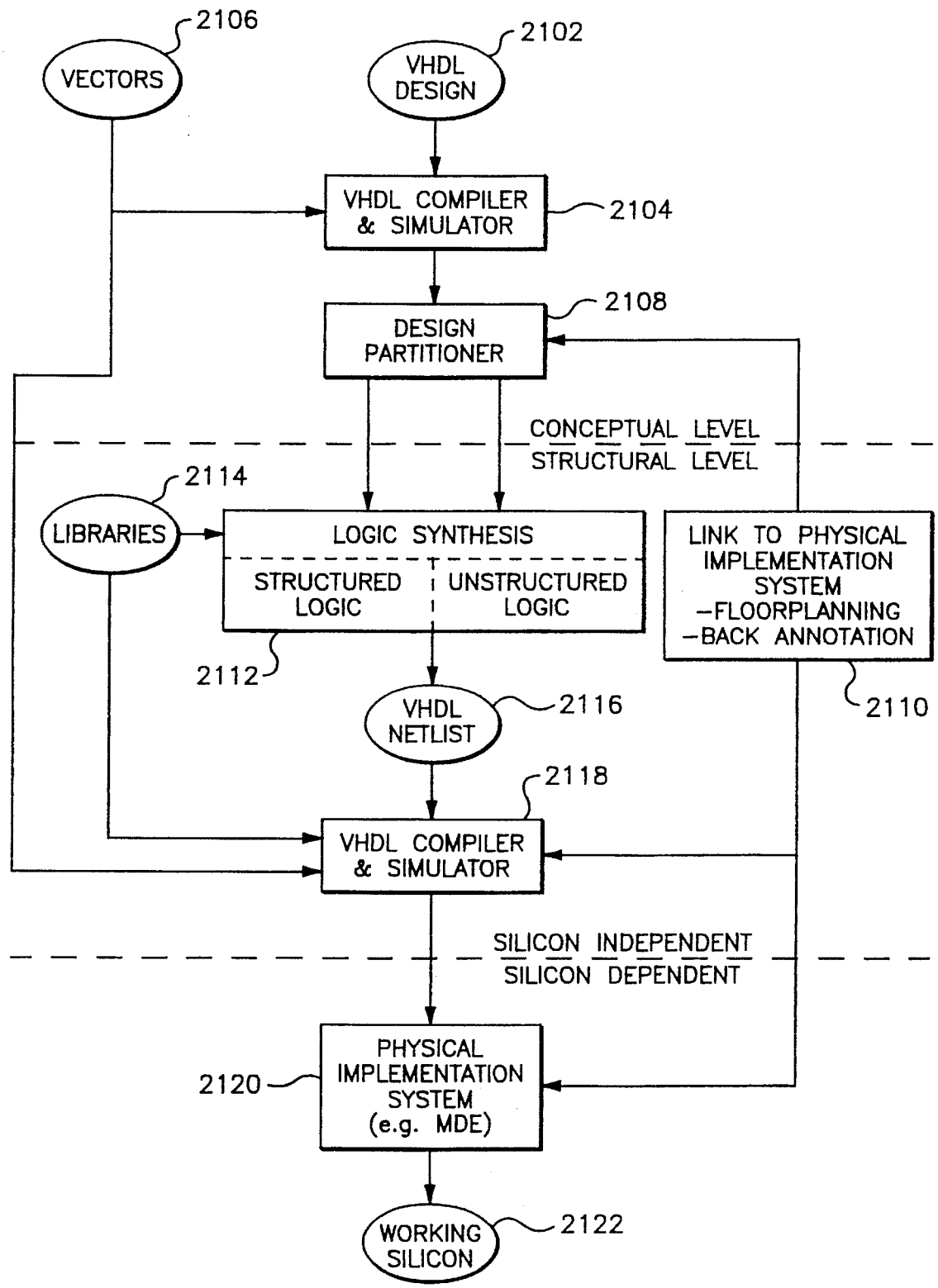
FIG. 21 is a block diagram of the methodology of the present invention.

FIG. 21 shows a more generalized arrangement of the methodology of the present invention, in such terms that one skilled in the art to which the invention most nearly pertains could readily implement the methodology.

At the conceptual level, a behavioral description 2102 of the target device is formulated in a high-level language, such as VHDL. The behavioral description is compiled and simulated 2104 using test vectors 2106 to verify the design description. The behaviorally-verified design is partitioned 2108 into suitable architectural blocks, as described above. Partitioning allows for the critical link 2110 to the physical implementation of the target device, incorporating critical size (area) constraints (i.e. floor planning) and critical timing (speed) information (i.e back annotation).

At the structural level, the partitioned design is provided to logic synthesis tools 2112 which formulate both structured and unstructured logic (functional blocks). Additional information regarding the functional blocks is derived from libraries 2114. Importantly, the timing/area constraints introduced through the partitioner 2108 are embedded at the logic synthesis stage. The output of the logic synthesizer 2112 is a net list 2116 for the target device, such as in VHDL, which is compiled and re-simulated 2118 (2104), using the test vectors 2106 and pre-defined information about blocks contained in the libraries 2114. If necessary, updated timing/area constraints are provided back through the partitioner 2108 and the target device is re-synthesized 2112 to meet the desired goals. By iteratively repeating this process, both the behavioral and structural descriptions of the target device can be fine tuned to meet and/or modify the design criteria.

At both the conceptual (behavioral) and structural levels, the design of the target device is technology (silicon) independent.

After a valid, verified net list has been described, the structural description of the target device is provided to a suitable silicon compiler (Physical Implementation System) 2120, such as LSI Logic's MDE, to create a working device 2122. At this stage, the tools required are technology (silicon) dependent.

FIG. 22-23

Figure 22:
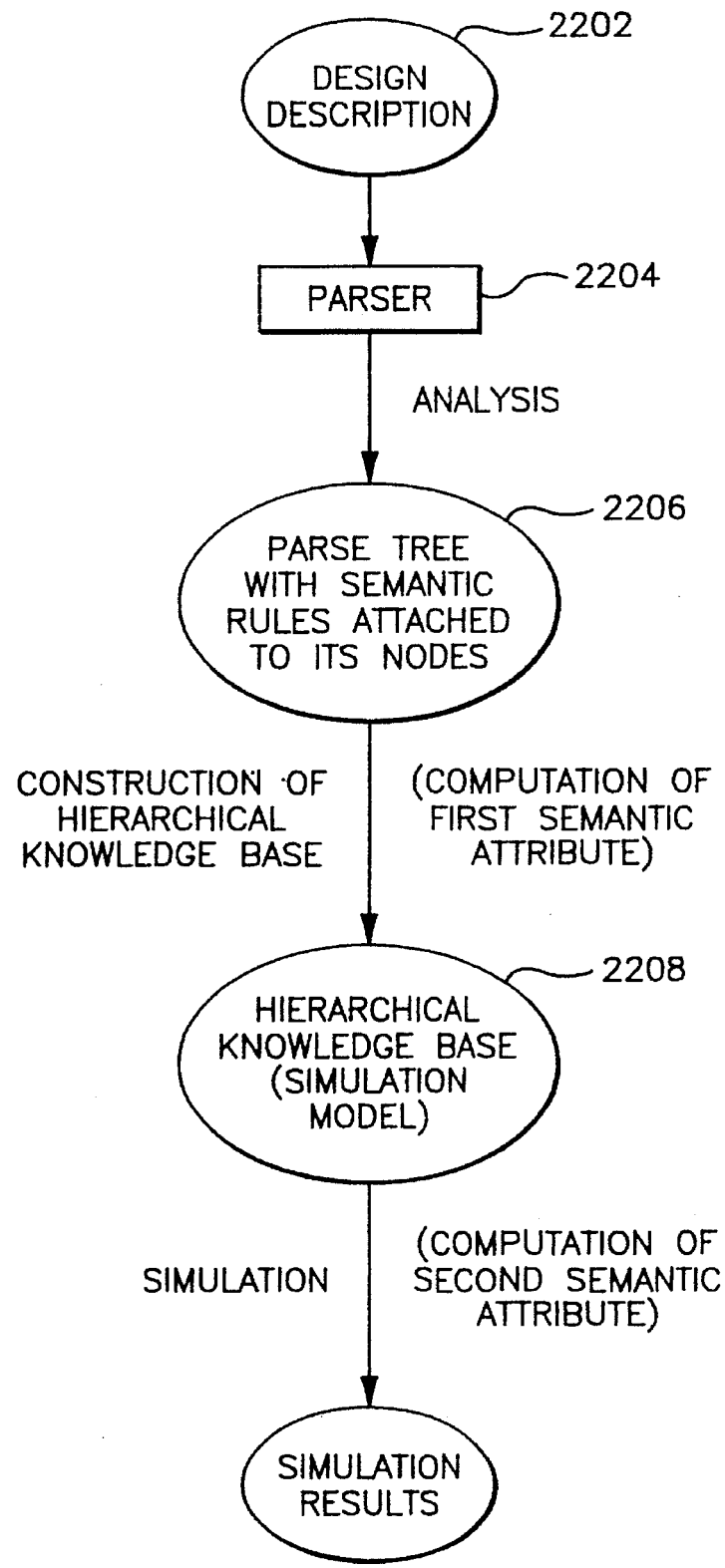
FIG. 22 is a block diagram of the Analyzer portion of the present invention.
Figure 23:
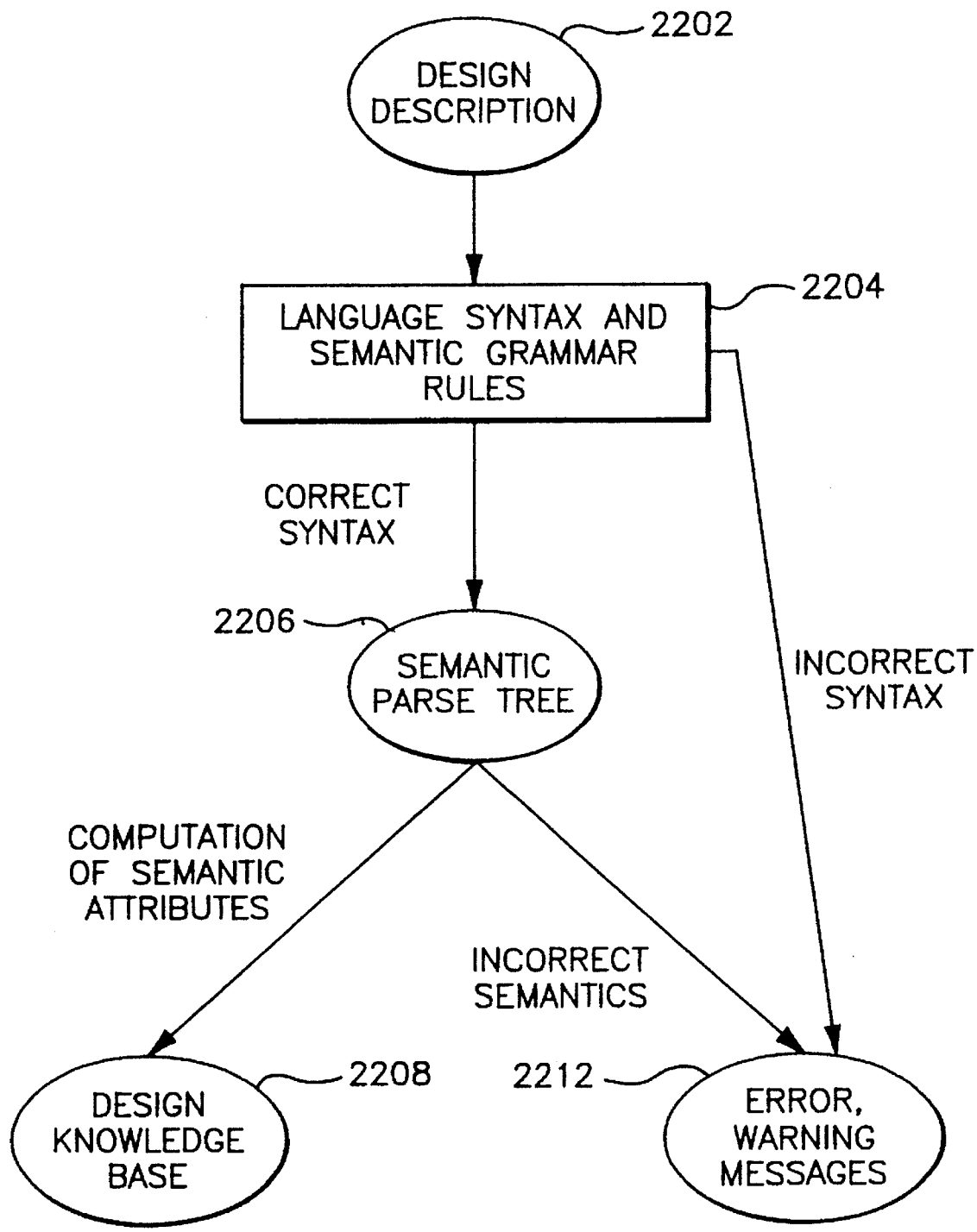
FIG. 23 is a block diagram showing the Analyzer.

FIGS. 22 and 23 illustrate a hierarchical knowledge base approach to simulate hardware descriptions in a high-level Hardware Description Language (HDL). In this approach, a knowledge base is constructed corresponding to each functional block of the hardware description. The hierarchical relationships among the various blocks in the description is mapped on to the knowledge base corresponding to those blocks. The hierarchical knowledge base thus formed is used for simulating the hardware description. Unlike previous approaches to simulation and verification of digital circuits (devices) described in a HDL, there is no need for intermediate translation steps.

In the past, artificial intelligence techniques have been used in formal verification and hybrid simulation of digital hardware to address the problem of combinatorial explosion of exhaustive logic simulation. In one approach, structural and behavioral descriptions of a design are first translated into first order clauses in Prolog. This set of clauses asserted in a Prolog data base can be viewed as a "flat" knowledge base. The hierarchy in the design is enforced implicitly by suitable relationships among the assertions in the knowledge base. A theorem prover is then used to establish the equivalence between the structural specification and the behavioral description to formally verify the design as represented by the data base. This approach has the disadvantages of translating a HDL description of a design into first order clauses and maintaining a large knowledge base which is difficult to manage for complex, hierarchical systems. In another approach, hybrid simulation is used to verify digital designs, the design is described as an interconnection of functional modules in a first order language, such as Prolog. The design may be hierarchical with the lowest level being Boolean gates. It is then simulated with both numerical and symbolic input signal values. This, again, has the drawback of having to maintain a large Prolog description for complex hierarchical designs.

The present methodology differs from the previous approaches by not having to go through intermediate translation steps, and not having to maintain a Prolog description of the design. Generally there are three steps in the present methodology:

Analysis, wherein the input description is analyzed for syntactic and semantic correctness, and a parse tree is formed. Each node in the parse tree is associated with a semantic rule.

Construction of the hierarchical knowledge base, wherein the semantic rules associated with nodes of the parse tree are used to construct a knowledge base for each block of the description, and the hierarchical relationships among the knowledge bases are derived from the semantic rules. The knowledge bases contain simple assertions and methods to compute functions and procedures present in the source description. The also make up the basis for other design tools.

Simulation, wherein using these simple assertions and computation methods contained in the knowledge bases, the output signal values are calculated for a given set of input signal values. The input stimulus can be either symbolic expressions or numerical values.

FIG. 22 shows the steps in simulating a design description. Beginning with a design description 2202 written in a formal, high-level language, the description is analyzed (parsed) 2204 using, for instance, definite clause translation grammars (DCTG) to form a parse tree 2206. In the parse tree, semantic rules are attached to each node. Each syntactic rule for the formal (high-level) language is associated with one or more semantic rules. Preferably, two semantic rules are associated with each syntactic rule—one of the semantic rules is used to verify the semantic description of the description, and the other semantic rule is used to simulate the description. Each rule has a semantic and a syntactic part. The semantic part has two attributes, namely, "check_semantics" and "execute". The semantic rules specify how these attributes are computed and verified. Using this technique, it is not necessary to go through intermediate translation steps to analyze and execute a description. Rather, the methods of analysis and execution are specified in conjunction with the syntactic rules of the language.

After a successful parse of the given description, each node in the parse tree thus formed is associated with the attributes as specified in the DCTG rules of the language. The computation of an attribute attached to a node can be a recursive transversal of sub-trees associated with the node. For semantic analysis, one semantic attribute verifies whether any semantics of the language is violated, and error messages (see FIG. 23; 2212) would be generated. These violations include redefinition of objects within the same scope and incorrect argument types to a procedure. Only a correct description is passed on to the hierarchical knowledge base 2208. Thus the analysis of the description ensures that it conforms to the syntax and semantics of the HDL description, and leads to the construction of a valid hierarchical knowledge base.

The hierarchy in a design description can be of two kinds. One is imposed by the structural design description in which a design entity (component, process, function, architecture, configuration) is composed of several other design entities. The second relates to scoping and visibility rules of the language. The knowledge base 2208 is formed, i.e. one knowledge base for each design entity, after the syntax and semantic analysis of the input HDL description. Each knowledge base has a set of unit clauses which correspond to all the static declarations, default values of signals, variables and the data structures necessary for simulation corresponding to the design entity. The hierarchical relationships among the knowledge bases are automatically derived while analyzing the design description using the DCTG rules of the HDL. This corresponds to a direct mapping of the hierarchy in the hardware design description. The need for a hierarchical knowledge base also arises due to the scope and visibility rules of a formal language that is being analyzed. The scoping and visibility rules are also used to determine the relationships among the design entity knowledge bases. The hierarchical knowledge base 2208 makes up a simulable model of the design. Other design tools such as synthesis and partitioning tools (discussed hereinbefore) also use the knowledge bases for extracting design information.

In the past, because of the scope and visibility of the rules of a formal language, in both translation and compilation, every identifier is given a unique names. However, in the case of simulation, when the description is being executed directly, this technique is not feasible.

The description contained in the knowledge base may contain different levels of abstraction of hardware design, namely, behavioral, RTL and gate level descriptions. Simulation involves execution of all the functions, procedures and processes for generating transactions on the drivers. A driver is associated with every signal that appears in a signal assignment statement and is represented by a sequence of transactions (each transaction is a value/time pair). Generating transactions, ordering them according to certain constraints, and scheduling them at a certain time is the key to simulation. The input test vectors for simulation are asserted in the knowledge base corresponding to the design entity in which the input signal appears. The test vectors can be either symbolic expressions or numerical values. The DCTG rules are again applied to the simulation data structures stored in the knowledge bases, and a second semantic attribute ("execute") is computed, this set of semantic rules constitutes the simulation engine. It includes computation of values of arithmetic expressions, Boolean expressions, symbolic expressions, time expressions, execution of sequential and concurrent statements, and generation of transactions. The computation is ordered by the simulation semantics of the language in conjunction with the hierarchical relationships. After generating transactions for all drivers, they are ordered with regard to time, synchronicity and simultaneity. As simulation time advances, the drivers update the values of the associated signals. This causes events to occur on the signals which may cause certain processes to "wake up" and in turn lead to the occurrence of more events. The next step is to schedule the events on the signals. This is handled by a scheduler which looks at the event ordering and generates unit clauses related to the time, signal and value of a scheduled event. The final step is to assign the value to the signal at the appropriate time.

It may happen that there could be multiple drivers due to multiple signal assignments in the source description. For the same signal, multiple drivers might try to assign values at the same time. In such a case, the value is resolved by a resolution function associated with the signal, and the resolved value is assigned to the signal. This leads to unit clauses which give the final resolved values of every signal present in the design description, in the simulation results 2210.

FIG. 23 is an overview of the types of rules, described above, for defining the correct relationship between objects in the constructed knowledge bases, for converging to correct structural representations of behaviorally-specified designs, and for enforcing a "good" style of VHDL code leading to the correct structural representations.

Prolog provides a useful tool for implementing the described methodology. Prolog grammars such as DCTG are useful in associating semantic rules with syntactic rules of the hardware description language (e.g. VHDL), and the inference engine contained in Prolog makes it straightforward to handle derivation of the inter-relationships between the different entities in the knowledge base.

The hierarchical knowledge base, described above, helps maintain the hierarchical nature of large hardware designs and permits large hardware descriptions to be directly simulated without having to go through intermediate translation steps. The knowledge base can be used by other tools, such as those set forth above.

Parent U.S. Pat. No. 5,222,030 provides an executable listing of the Analyzer/Interpreter, as described with respect to FIGS. 22 and 23.

FIGS. 25–27

FIGS. 25 through 27 show representative screen displays of the methodology of the present invention, as they would be presented to the user. In the main, the display of FIG. 25 is discussed.

In the lower left "window" of the display of FIG. 25 is shown a VHDL description of a counter ("while x<a loop . . ."), created by the user. The user then simulates the code, at the high-level, to ensure that it the description is correct, by providing operands ("variables").

The system then creates "data flow", relating to the sequencing of operations and the parallel or serial configuration of functional blocks required to realize the counter, and presents the results to the user in graphical and/or textual form. In this example, seven design alternatives are displayed in the upper left window ("Design: [[1] . . . "). One of these design alternatives, selected by the user for viewing, is displayed in the upper right window (as interconnected circle and square primitives) In the lower right window is displayed the estimated area that would be required to implement the design, and is technology dependent. Also displayed in the upper left window are estimates of functional units (registers, muxes) that would be consumed by the various design alternatives. This all relates to exploring the design space, and allows the user to perform a "what if" analysis for choosing a preferred design in terms of size, speed, performance, technology and power. (In the upper left window of FIG. 27 are shown size estimates for particular functional blocks labelled "8.1", "11.1" etc. ) All of the above is performed prior to any synthesis, to allow the user to make intelligent trade-offs leading to a viable design, by interacting at the architectural level.

By partitioning, accurate timing estimates can be derived as discussed hereinbefore (not shown in the screen displays).

Automated Design: Summary

A methodology is described for the implementation of complex digital systems. The methodology includes:

a) a mechanism for semantic capture of the specification and description of the digital hardware for which an implementation is desired;

b) hardware descriptions embodied in a specification language, such as VHDL (or VHDL Intermediate Format), having well standardized semantics;

c) utilization of an appropriate software language, such as Extended Definite Clause Grammar (EDCG) and Prolog, for formal capture of the semantics of b);

d) direct execution of the semantics and of the behavior of the hardware described in a) and b);

e) execution of the intent contained in the description of a) without a translation step, such as with Prolog and its predicate logic formalism (knowledge representation of the digital hardware is achieved via the imbedding provided by predicate logic, semantic description of EDCG, Prolog and the VHDL language);

f) system level partitioning for creating optimized versions of hardware functional blocks for trade-off display, predicting for estimating hardware resources (sizes), speed and power, and mapping from one level of design representation to another;

g) isomorphism among various levels of partitioned hardware (across semantics, structure, behavior, logic and functions);

h) synthesis of hardware directly from semantics and intent contained in a) through f) into low level structural logic descriptions;

i) methodology for closure between the timing goals of a) through g); and j) methods for displaying knowledge in a), d), e) and f).

One skilled in the art to which the present invention most nearly pertains will readily be able to implement the invention based on the description set forth above. The above-described embodiment is set forth in terms of exemplary, well known logic synthesis tools, especially for deriving the structural representation and physical implementation from the RTL description of the device being designed. Other implementations would largely be driven by the particular technologies and logic synthesis tools that may be employed.

Parent U.S. Pat. No. 5,222,030 provides additional detail of the Partitioner, the Synthesis Controller ("SYN CONTROLR"), and the Analyzer.

Model Generation for Automated Designs

Figure 28:
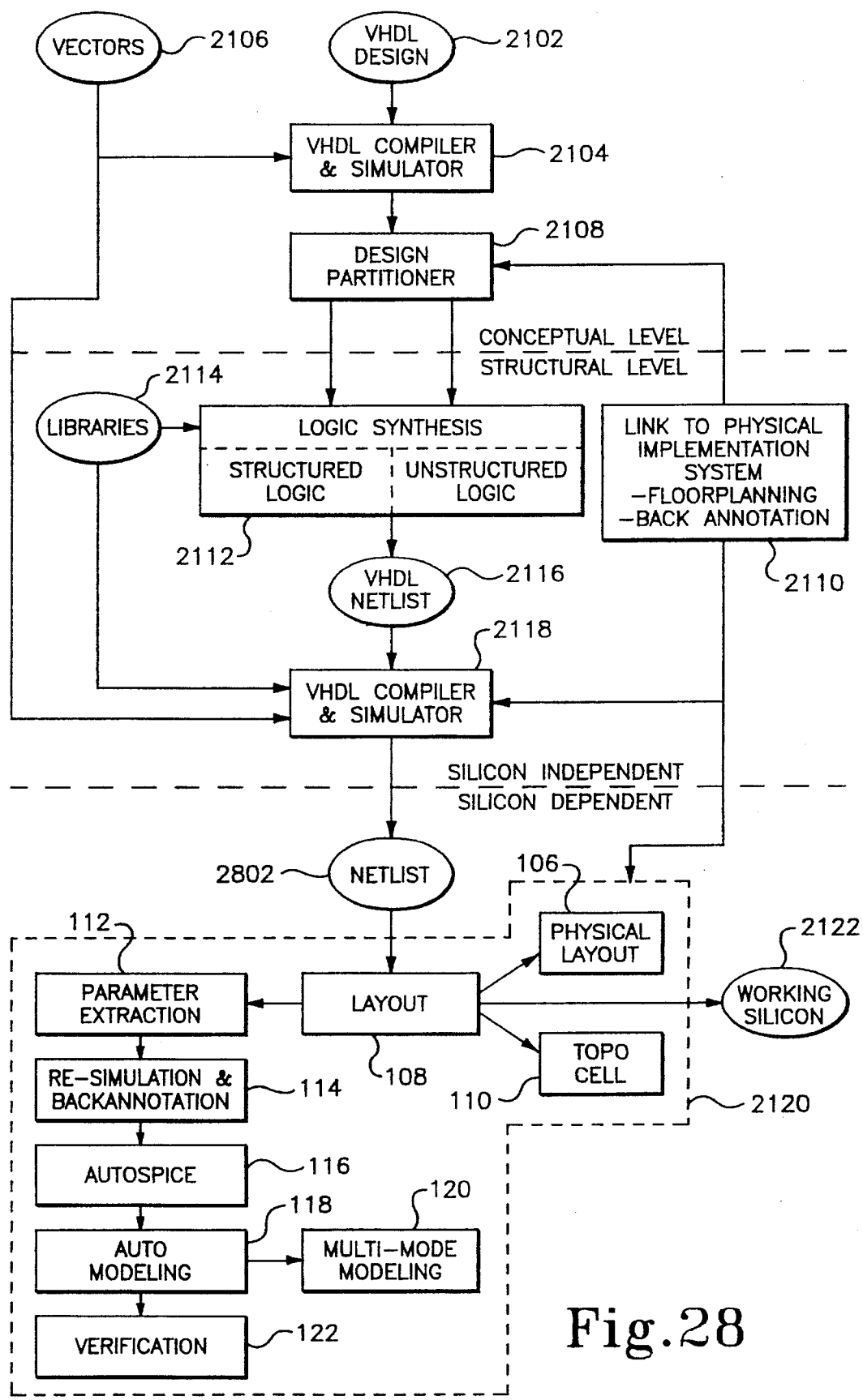
FIG. 28 is a block diagram of the logic model generation process (e.g., of FIG. 1) applied to automated design (e.g., FIG. 21), according to the invention.

The model generation process described hereinabove with respect to FIGS. 1–12 can be applied to the automated generation of electronic designs such as is illustrated in FIGS. 13–27. An exemplary illustrative method for doing so is shown in FIG. 28. FIG. 28 "borrows" some of the features of the automated design process depicted in FIG. 21 and the automated model generation process depicted in FIG. 1.

The process of FIG. 28 is comprises two main parts: an automated design generation process and a model generation process. The automated design generation process begins at the conceptual level, with a behavioral description 2102 of the target device. The behavioral description is compiled and simulated 2104 using test vectors 2106 to verify the design description. The behaviorally-verified design is partitioned 2108 into suitable architectural blocks, as described above.

Next, at the structural level, the partitioned design is provided to logic synthesis tools 2112 which formulate both structured and unstructured logic (functional blocks). Additional information regarding the functional blocks is derived from libraries 2114. As before, the timing/area constraints introduced through the partitioner 2108 are embedded at the logic synthesis stage. The output of the logic synthesizer 2112 is a net list 2116 for the target device, such as in VHDL, which is compiled and re-simulated 2118 (2104), using the test vectors 2106 and pre-defined information about blocks contained in the libraries 2114. If necessary, updated timing/area constraints are provided back through the partitioner 2108 and the target device is re-synthesized 2112 to meet the desired goals. By iteratively repeating this process, both the behavioral and structural descriptions of the target device can be fine tuned to meet and/or modify the design criteria.

At both the conceptual (behavioral) and structural levels, the design of the target device is technology (silicon) independent.

After a valid, verified net list 2802 has been described, the structural description of the target device is provided to a suitable silicon compiler (Physical Implementation System) 2120, such as LSI Logic's MDE, to create a working device 2122. In the silicon compiler, a suitable technology is selected and a low-level description of the electronic design is produced. The layout process 108 produces a physical layout 106 for the electronic design. This leads to the ultimate production of the working silicon integrated circuit 2122.

Data from the layout process 108 is processed as described hereinabove with respect to FIG. 1, et seq. to produce an accurate model of the electronic design which accounts for layout-induced effects such as parasitic capacitances, interconnect length, etc.

As used herein, the term "electronic system" refers to a circuit, a device, or a plurality of interconnected devices.

What is claimed is:

1. A method of verifying a logic model of an electronic design, in an ECAD system, comprising:

providing a logic-level model of the electronic design;

obtaining timing and delay information obtained from a transistor-level model simulation of the design; and providing the timing and delay information to the logic-level model for simulation.

2. A method of creating and validating a structural description of an electronic design from a behavioral description thereof, comprising:

providing a behavioral description of the electronic design;

simulating and changing the behavioral description of the design;

partitioning the behavioral description into a number of architectural blocks and constraining the architectural choices to those which meet high-level timing goals; and synthesizing the architectural blocks into a structural description of the design.

3. A method of creating an electronic design on an ECAD system, comprising:

synthesizing a physical description of the electronic design from a behavioral description of the electronic system;

generating an interim logic-level model representation of the design; and simulating the logic-level model representation of the electronic system using information derived from the physical description of the design.

4. A method of designing an electronic system on an ECAD system, comprising:

synthesizing a physical description of the electronic system from a behavioral description of the electronic system, generating an interim logic-level model representation of the electronic system; and simulating the logic-level model representation of the electronic system using information derived from the physical description of the electronic system.

5. An electronic design system comprising:

means for creating a net-list description of an electronic design from a behavioral description of the design;

means for analyzing the behavioral description for input-to-output dependencies corresponding to logical relationships between inputs and outputs of said design and for creating a list of the input-to-output dependencies;

means for determining input patterns and corresponding output transitions, according to said input-to-output dependencies, and for creating a list of the input patterns;

means for performing a circuit-level simulation of the design according to said lists of input-to-output dependencies and input patterns;

means for extracting delay and timing information from the circuit-level simulation of the design;

means for performing a gate-level simulation of the design, using the extracted delay and timing information, and for creating a logic-level model the design; and means for simulating the logic-level model of the design.

6. An electronic design system, according to claim 5, further comprising:

means for simulating a switch-level representation of the design; and means for comparing the switch-level and logic-level simulations.

7. An electronic design system, according to claim 5, further comprising:

means for providing information from the simulated logic-level model of the design in human-readable form in the form of a data sheet.

8. An electronic design system, according to claim 5, further comprising:

means for combining the timing information into the logic-level model to produce a single multi-mode logic model of the design.

9. An electronic design system, according to claim 5, further comprising:

means for automatically generating a translated test pattern file;

means for automatically generating a multi-mode file;

means for running a comparison simulation using the test pattern file and the multi-mode file; and means for comparing the results of the circuit-level simulation with the comparison simulation.

10. An automatic logic model generation system comprising:

means for operating on inputs and storing a net-list representation of an electronic design;

means for simulating performance of a logic-level model of the design as interconnected logic blocks;

means for simulating performance of a transistor-level model of the design;

means for providing layout information to the transistor-level model of the design;

means for providing timing and delay information obtained from the simulated performance of the transistor-level model to the logic blocks; and means for synthesizing a physical description of the electronic system from a behavioral description of the electronic system.

11. An automatic model generation system, according to claim further comprising:

means for simulating a switch-level representation of the design;

means for comparing the logic-level simulation with the switch-level simulation, according to pre-determined criteria for success; and means for providing an indication of a result of said comparison.

12. An automatic model generation system, according to claim 10, further comprising:

means for providing timing and delay information obtained for the transistor-level simulation to the switch-level model.

13. An automatic model generation system, according to claim 10, further comprising:

means for providing said logic-level model in a human-readable data-sheet form.

14. Method of generating logic and timing models in an ECAD system, comprising:

operating on inputs and storing a net-list representation of an electronic design;

simulating performance of a logic-level model of the design as interconnected logic blocks;

simulating performance of a transistor-level model of the design;

providing layout information to the transistor-level model of the design;

providing timing and delay information obtained from the simulated performance of the transistor-level model to the logic blocks; and synthesizing a physical description of the electronic system from a behavioral description of the electronic system.

15. An automatic model generation system, according to claim 14 further comprising:

simulating a switch-level representation of the design;

comparing the logic-level simulation with the switch-level simulation, according to pre-determined criteria for success; and providing an indication of a result of said comparison.

16. An automatic model generation system, according to claim 14, further comprising:

providing timing and delay information obtained for the transistor-level simulation to the switch-level model.

17. An automatic model generation system, according to claim 13, further comprising:

providing said logic-level model in a human-readable data-sheet form.

* * * * *